(12) United States Patent
Yu

(10) Patent No.: US 12,628,509 B2
(45) Date of Patent: May 12, 2026

(54) DISPLAY PANEL WITH FILM WITH MARKS TO MAKE TRANSMISSIVE FOR SENSOR, PREPARATION METHOD THEREOF AND DISPLAY APPARATUS THEREOF

(71) Applicant: Hubei Yangtze Industrial Innovation Center Of Advanced Display Co., Ltd., Wuhan (CN)

(72) Inventor: Quanpeng Yu, Wuhan (CN)

(73) Assignee: Hubei Yangtze Industrial Innovation Center of Advanced Display Co., Ltd., Wuhan (CN)

( * ) Notice: Subject to any disclaimer, the term of this patent is extended or adjusted under 35 U.S.C. 154(b) by 446 days.

(21) Appl. No.: 18/217,209

(22) Filed: Jun. 30, 2023

(65) Prior Publication Data

US 2023/0345773 A1 Oct. 26, 2023

(30) Foreign Application Priority Data

Mar. 14, 2023 (CN) .......................... 202310259076.5

(51) Int. Cl.
*H10K 59/124* (2023.01)
*H10K 59/12* (2023.01)
*H10K 71/20* (2023.01)

(52) U.S. Cl.
CPC ....... *H10K 59/124* (2023.02); *H10K 59/1201* (2023.02); *H10K 71/231* (2023.02)

(58) Field of Classification Search
CPC . H10K 71/162; H10K 71/231; H10K 59/1201
See application file for complete search history.

(56) References Cited

U.S. PATENT DOCUMENTS

| | | | | |
|---|---|---|---|---|
| 2021/0141304 A1* | 5/2021 | Liu | ........................... | G03F 1/38 |
| 2022/0005906 A1* | 1/2022 | Jeong | ................... | H10K 59/126 |
| 2022/0020952 A1* | 1/2022 | Ikenaga | ............... | H10K 59/873 |
| 2022/0037419 A1* | 2/2022 | Ma | ........................ | H10K 59/121 |
| 2022/0199905 A1* | 6/2022 | Lee | ........................ | H10K 71/00 |
| 2024/0172545 A1* | 5/2024 | Yu | ........................ | H10K 59/124 |

OTHER PUBLICATIONS

U.S. Appl. No. 18/425,105, filed 2024.*
U.S. Appl. No. 18/425,105, Yu et al., filed Jan. 29, 2024. (Year: 2024).*

* cited by examiner

*Primary Examiner* — Abdulmajeed Aziz
*Assistant Examiner* — Steven Y Horikoshi
(74) *Attorney, Agent, or Firm* — KDW Firm PLLC

(57) ABSTRACT

A display panel and a preparation method thereof and a display apparatus are provided. The display panel includes a display region. The display region includes a first display region. The display panel further includes a first film located in the first display region, the first film includes at least one mark group, and each mark group includes multiple marks. In the technical solution provided, the mark group included in the first film is just etching traces of laser etching in the process of display panel preparation, and multiple marks are included in the mark group.

27 Claims, 17 Drawing Sheets

300

310

300

310

AA'

200

420

300

300

310

300

310

300

310 a

300

310 a

310

300

310

310

300

310/310A

310/310B

300

310/310B

310/310A

300

310/310A

310/310B

300

310/310B

310/310C

310/310A

300

310/310A

310/310B

<u>300</u>

310/310A

310/310B a

<u>110</u>

330/340

200

400

110

440

110

330

340

330

330

300

330

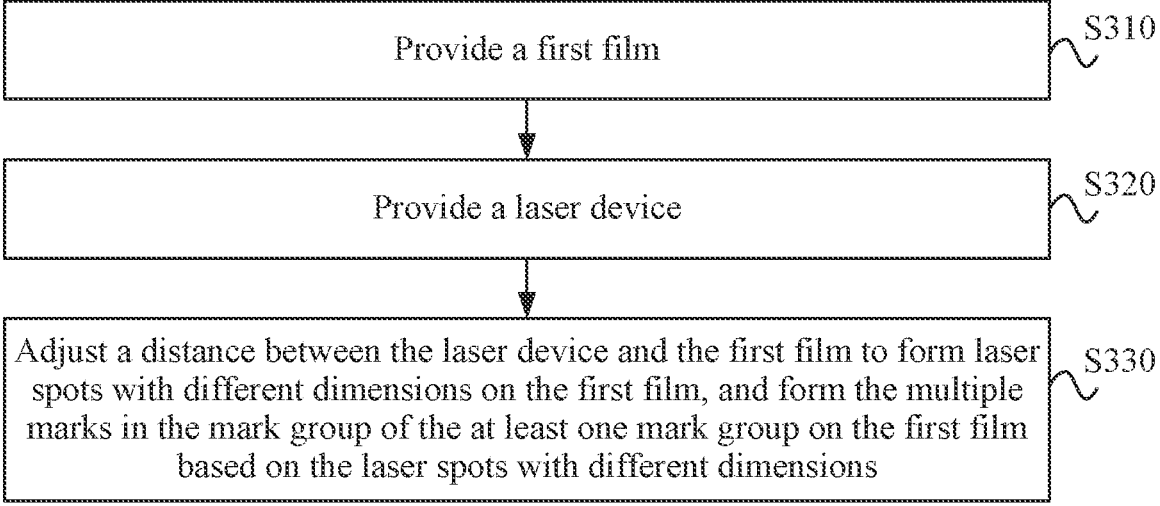

Provide a first film  S310

Provide a laser device  S320

Adjust a distance between the laser device and the first film to form laser spots with different dimensions on the first film, and form the multiple marks in the mark group of the at least one mark group on the first film based on the laser spots with different dimensions  S330

FIG. 32

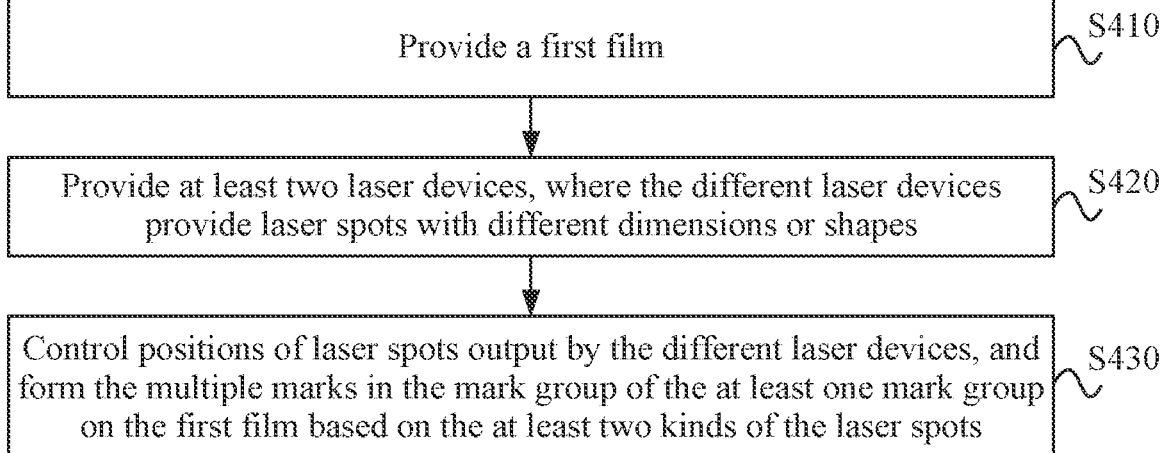

Provide a first film  S410

Provide at least two laser devices, where the different laser devices provide laser spots with different dimensions or shapes  S420

Control positions of laser spots output by the different laser devices, and form the multiple marks in the mark group of the at least one mark group on the first film based on the at least two kinds of the laser spots  S430

FIG. 33

DISPLAY PANEL WITH FILM WITH MARKS TO MAKE TRANSMISSIVE FOR SENSOR, PREPARATION METHOD THEREOF AND DISPLAY APPARATUS THEREOF

CROSS-REFERENCE TO RELATED APPLICATIONS

This application claims the priority to Chinese Patent Application No. 202310259076.5 filed on Mar. 14, 2023, the disclosure of which is incorporated herein by reference in its entirety.

TECHNICAL FIELD

This invention relates to the technical field of display panel, and more particularly, to a display panel, a preparation method thereof and a display apparatus.

BACKGROUND

With the development of display technology, display screens have been widely used in people's production and life. Taking cellphone as an example, smartphones are used more and more widely and have more and more functions, and have become necessary electronic devices for people's daily life.

In the conventional preparation technique of films in a display panel, etching technique is a common technique solution.

SUMMARY

A display panel, a preparation method thereof and a display apparatus are provided according to embodiments of the present invention. In the display panel, a first film includes at least one mark group, and multiple marks are included in the mark group.

In a first aspect, a display panel is provided according to embodiments of the present invention, which includes a display region, and the display region includes a first display region.

The display panel further includes: a first film.

The first film is located in the first display region, and the first film includes at least one mark group, and a mark group of the at least one mark group includes multiple marks.

In a second aspect, a display apparatus is provided according to embodiments of the present invention. The display apparatus includes the display panel according to the first aspect.

In a third aspect, a preparation method of a display panel is provided according to embodiments of the present invention. The preparation method includes as follows.

A first film is provided.

The display panel is etched by using a laser, at least one mark group is formed on the film, and the mark group includes multiple marks.

A display panel and a preparation method thereof and a display device are provided according to embodiments of the present invention. The display panel includes a display region. The display region includes a first display region. The display panel further includes a first film located in the first display region, the first film includes at least one mark group, and each mark group includes multiple marks. In the technical solution according to an embodiment of the present invention, the mark group included in the first film is just etching traces remaining after the laser etching in the process of display panel preparation, and multiple marks are included in the mark group.

BRIEF DESCRIPTION OF DRAWINGS

To illustrate technical solutions in embodiments of the present invention more clearly, drawings used in description of the embodiments are briefly described hereinafter. Apparently, the drawings described below merely illustrate some embodiments of the present invention, and the person of ordinary skill in the art can obtain other drawings based on these drawings on the premise that no creative effort is made.

FIG. 32 is a flowchart of another preparation method of a display panel according to an embodiment of the present invention; and FIG. 33 is a flowchart of another preparation method of a display panel according to an embodiment of the present invention.

DETAILED DESCRIPTION

For enabling the person skilled in the art to better understand the solutions of the present invention, the technical solutions in embodiments of the present invention are described clearly and completely in conjunction with the drawings in embodiments of the present invention. Apparently, the embodiments described below are part, rather than all, of the embodiments of the present invention. Based on the embodiments in the present invention, all other embodiments obtained by the person skilled in the art on the premise that no creative efforts are made are within the scope of the present invention.

It is to be noted that the terms "first", "second" and the like in the description, claims and drawings of the present invention are intended to distinguish between similar objects and are not necessarily used to describe a particular order or sequence. It is to be understood that the data used in this way is interchangeable where appropriate so that the embodiments of the present invention described herein may also be implemented in a sequence not illustrated or described herein. Furthermore, terms such as "include", "have"; and any deformation thereof, are intended to cover non-exclusive inclusion, e.g., a system, product, or device including a series of units is not necessarily limited to those units expressly listed, but may include other units not expressly listed or inherent to such system, product or device.

Figure 1:
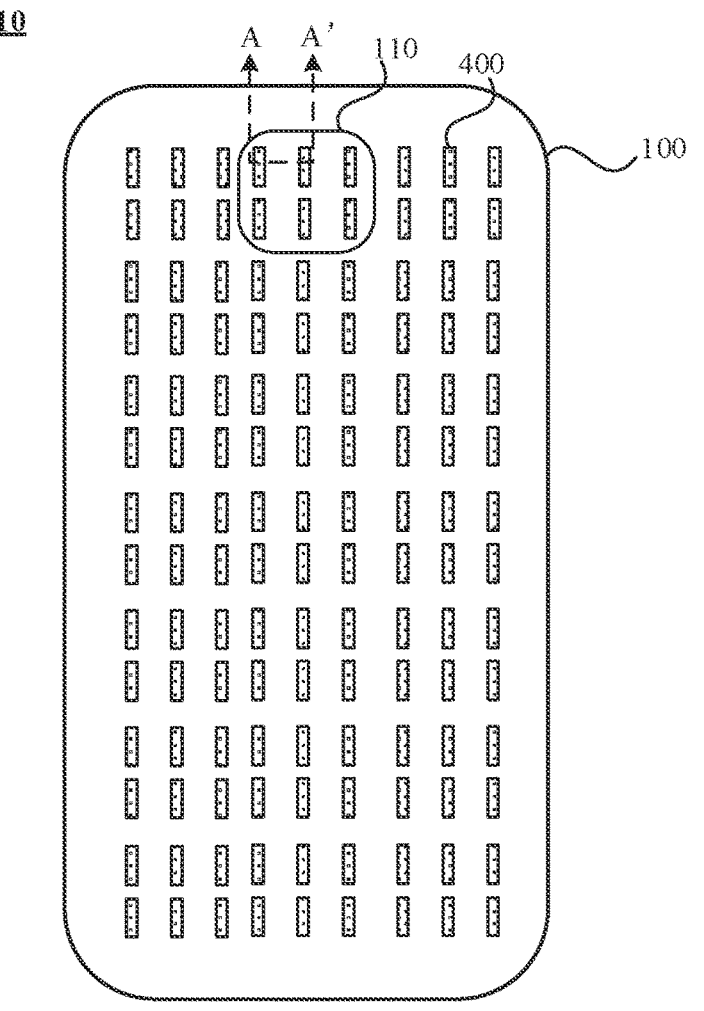
FIG. 1 is a structural diagram of a display panel according to an embodiment of the present invention.
Figure 2:
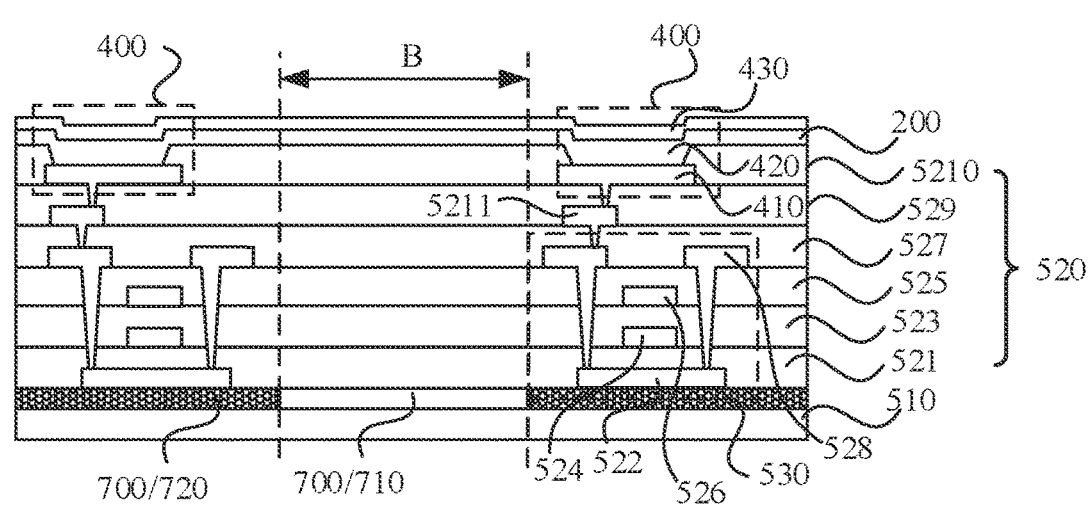
FIG. 2 is a structural diagram taken along line AA' of FIG. 1.
Figure 3:
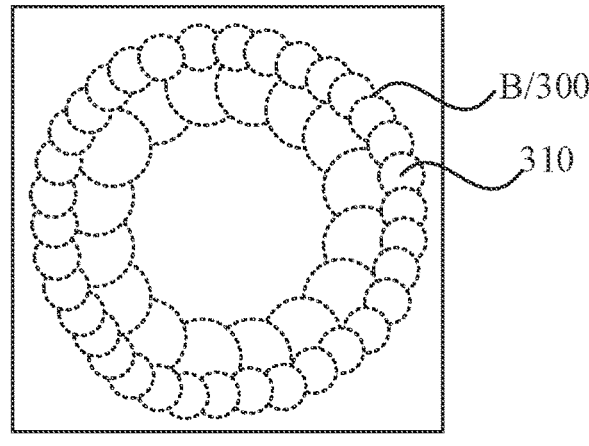
FIG. 3 is a structural diagram of a first film according to an embodiment of the present invention.

FIG. 1 is a structural diagram of a display panel according to an embodiment of the present invention; FIG. 2 is a structural diagram taken along line AA' of FIG. 1; FIG. 3 is a structural diagram of a first film according to an embodiment of the present invention. Referring to FIG. 1 to FIG. 3, a display panel 10 is provided according to an embodiment of the present invention. The display panel 10 includes a display region 100, and the display region 100 includes a first display region 110. The display panel 10 further includes a first film 200 located in the first display region 110, the first film 200 includes at least one mark group 300, and the mark group 300 includes multiple marks 310.

Specifically, the display panel 10 includes a display region 100 for implementing a display function of the display panel 10. Referring to FIG. 1, the display region 100 further includes a first display region 110. Specifically, both the display region 100 and the first display region 110 are provided with multiple light-emitting elements 400, that is, ensuring the display effect of the entire display panel 10.

Further, for the first display region 110, for example, the first display region 110 may have a component, integrated with an opto-sensor, such as a camera or a fingerprint recognition structure arranged therebelow, thus the first display region 110 may implement the function of optical signal transmission, such as at least one of photographing and biometric identification, in addition to the function of light-emitting display. That is, the first display region 110 may be transmissive to external light rays in addition to implementing the display function, and may further implement a function such as photographing or user facial unlocking. The function of the first display region 110 is not specifically limited in the embodiments of the present invention.

Further, the light-emitting element 400 in the display panel 10 includes an anode layer 410, a display function layer 420 and a cathode layer 430. Electrons and holes generated between the anode layer 410 and the cathode layer 430 emit light when the electrons and the holes meet in the display function layer 420, thereby realizing displaying and light emission of the display panel 10. In the first display region 110, the cathode layer 430 in the light-emitting element 400 may be designed to be patterned, that is, ensuring that the cathode layer 430 in the first display region 110 has a light-transmissive region, and further, it is possible to ensure that the component, in which the opto-sensor is integrated, such as a camera or a fingerprint recognition structure arranged below the light-transmissive region of the cathode layer 430 in the first display region 110 can receive external light rays. Specifically, the cathode layer 430 may be laser etched when being prepared, and laser rays remove portions of the cathode layer 430. For example, laser is emitted from a backlight side of the display panel 10 to the cathode layer 430, and the laser rays remove part of the cathode layer 430 to form a hollow-out region, namely, the light-transmissive region, thereby realizing the patterned design of the cathode layer 430.

Further, the display panel 10 further includes a first film 200, the first film 200 includes at least one mark group 300, and the mark group 300 includes multiple marks 310. Here, the formation of the marks 310 in the mark group 300 may be remained traces generated by the etching technique during the preparation of the display panel 10, such as the laser etching marks remained after the laser etching. Based on the fact that at least one mark group 300 is included in the first film 300 and the numbers of marks 310 in the at least one mark group 300 are various, the variety of the etching process, for example, the variety of the etching track, the variety of the etching shape, in the preparation process of the display panel 10 is reflected, which are not specifically limited herein in the embodiments of the present invention, so that the etching effect of the display panel 10 is ensured, or the efficiency of etching of the display panel 10 is promoted, that is, the display effect of the display panel 10 is ensured.

Based on the above, the cathode layer 430 in the light-emitting element 400 is designed to be patterned by laser etching in the first display region 110. When the cathode layer 430 is etched, the generated etching marks 310 may remain in the display function layer 420, that is, the display function layer 420 may be the first film 200 mentioned above. Further, based on the fact that not only the cathode layer 430 in the display panel 10 is dependent on the technique of the laser etching, other films in which the marks 310 generated by the etching technique are remained may also be the first film 200, which is not specifically limited in embodiments of the present invention.

In summary, the display panel according to the embodiment of the present invention includes a first film located in the first display region, the first film includes at least one mark group, and each mark group includes multiple marks. The mark group included in the first film is just remained traces of etching by laser etching in the preparation process of the display panel, and multiple marks are included in the mark group, i.e., reflecting variety of the etching process, thereby ensuring the etching effect of the display panel, i.e., ensuring the display effect of the display panel.

Still referring to FIG. 2, the display panel 10 further includes: a substrate 510; an array layer 520 located on one side of the substrate 510, specifically, driving components 530 are included in the array layer 520. The first film 200 is an organic film located on the array layer 520.

Specifically, referring to FIG. 2, the display panel 10 includes the substrate 510 and the array layer 520 located on one side of the substrate 510. The array layer 520 includes multiple insulating layers and metal layers alternately arranged, and the array layer 520 includes the driving components 530, specifically includes a buffer layer 521, an active layer 522, a gate insulating layer 523, a gate layer 524, an intermetallic insulating layer 525, a capacitance metal layer 526, an interlayer insulating layer 527, a source drain layer 528, a flatten layer 529 and a pixel defining layer 5210. Optionally, a connection structure 5211 and an anode layer 410 are prepared on the flatten layers 529 and the interlayer insulating layer 527. Further, a thin-film transistor 531 and a capacitance are included in the driving components 530, and multiple thin-film transistors 531 and capacitances may be included in the array layer 520. Specifically, embodiments of the driving components 530 may be provided by the person skilled in the art according to practical situations, which is not limited here. For example, the driving components 530 include "7T1C"; "2T1C", where "T" represents a thin-film transistor, and "C" represents a capacitance.

Further, the first film 200 is an organic film located on the array layer 520, where the display function layer 420 in the light-emitting element 400 is an organic film, i.e., the first film 200 may be the display function layer 420.

Figure 4:
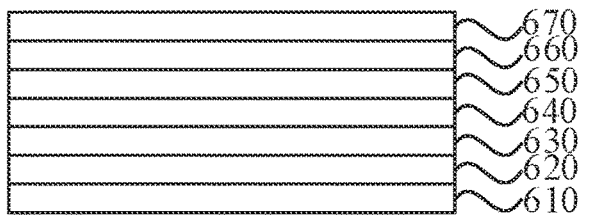
FIG. 4 is a structural diagram of a display function layer according to an embodiment of the present invention.

FIG. 4 is a structural diagram of the display function layer according to an embodiment of the present invention. Referring to FIG. 2 and FIG. 4, the display panel 10 further includes the display function layer 420 located at a side of the array layer 520 facing away from the substrate 510, the display function layer 420 includes multiple organic films, and the organic films include a combination of one or more of a hole injection layer 610, a hole transport layer 620, an electron injection layer 670 or an electron transport layer 660.

Specifically, referring to FIG. 2, the display function layer 420 is located between the anode layer 410 and the cathode layer 430, and the display function layer 420 emits light and displays, thereby realizing the display effect of the display panel 10. Specifically, referring to FIG. 4, the display function layer 420 includes multiple organic films. Specifically, the display function layer 420 includes a hole injection layer 610, a hole transport layer 620, an electron blocking layer 630, an emission layer 640, a hole blocking layer 650, an electron transport layer 660, an electron injection layer 670, and the like. The specific setting number and form of films based on the display function layer 420 can be adjusted adaptively according to practical situations, which is not specifically limited in the embodiments of the present invention.

Further, the first film 200 mentioned above is an organic film located on the array layer 520, that is, the first film 200 may be in the form of one organic film or a combination of multiple organic films mentioned in the description of the above display function layer 420.

Figure 5:
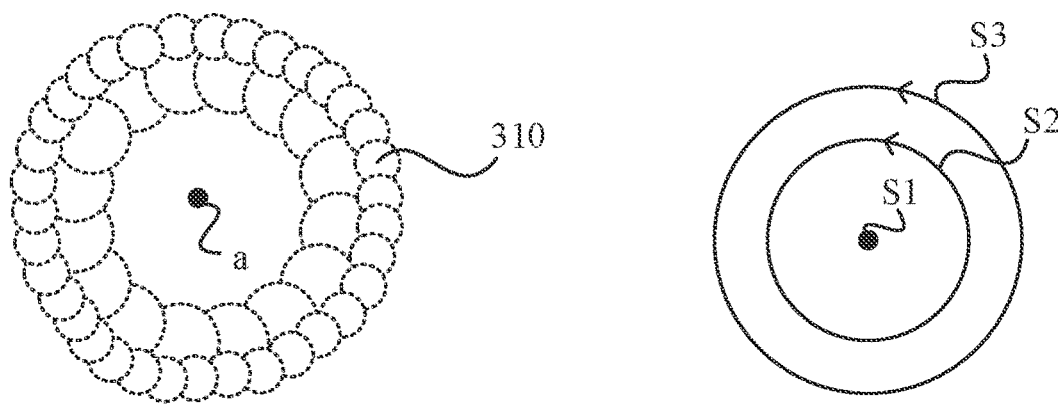
FIG. 5 is a structural diagram of a mark group according to an embodiment of the present invention.
Figure 6:
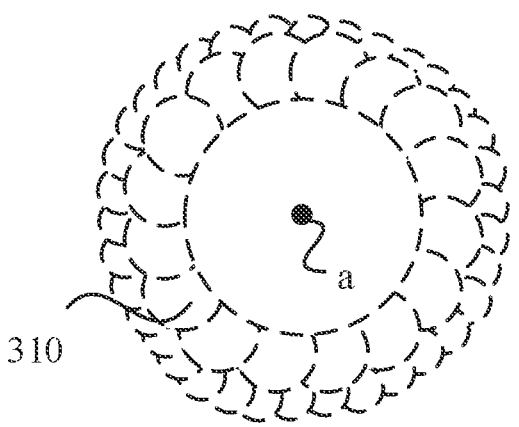
FIG. 6 is a structural diagram of another mark group according to an embodiment of the present invention.
Figure 6:
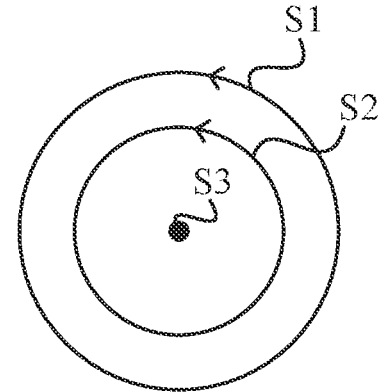
Figure 7:
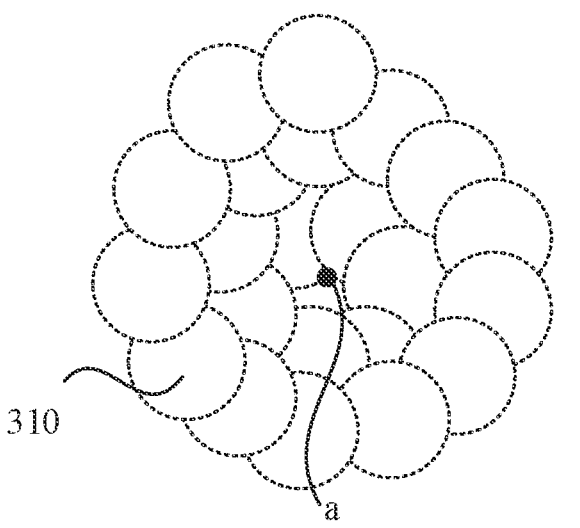
FIG. 7 is a structural diagram of another mark group according to an embodiment of the present invention.
Figure 7:
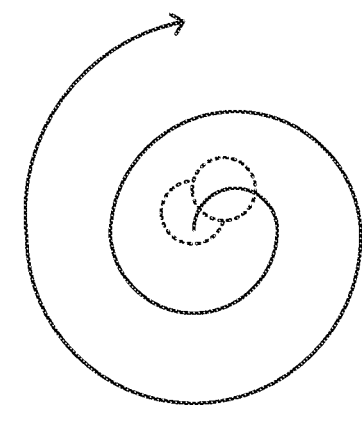
Figure 8:
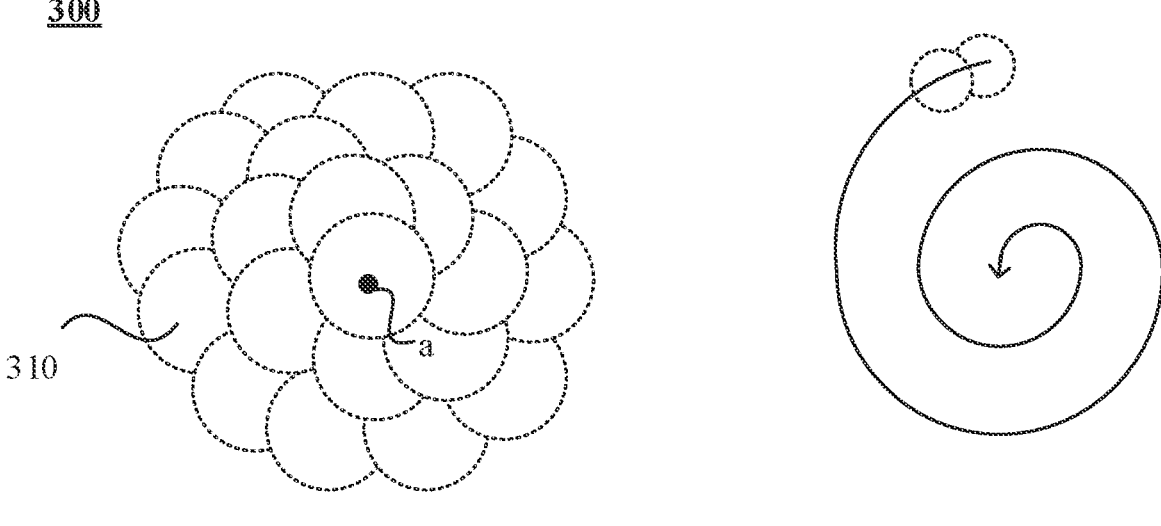
FIG. 8 is a structural diagram of another mark group according to an embodiment of the present invention.

FIG. 5 is a structural diagram of one mark group according to an embodiment of the present invention, FIG. 6 is a structural diagram of another mark group according to an embodiment of the present invention, FIG. 7 is a structural diagram of another mark group according to an embodiment of the present invention, and FIG. 8 is a structural diagram of another mark group according to an embodiment of the present invention. Referring to FIG. 5 to FIG. 8, multiple marks 310 in the mark group 300 are arranged curvilinearly.

Specifically, the mark group 300 includes multiple marks 310, and the multiple marks 310 are arranged curvilinearly, that is, to ensure a compact arrangement of the marks 310 in the mark region 330, to avoid the occurrence of a vacant region. Further, based on the curvilinear arrangements in different directions, it reflects that the arrangements of the marks 310 in the mark group 300 are various. Further, the arrangement of the marks 310 also reflects to a certain extent an etching track when the laser etches, that is, when the multiple marks 310 are arranged curvilinearly, the laser etching is also performed curvilinearly, so that a better etching effect of the region to be laser etched can be ensured. Furthermore, based on the curvilinear etching path, the completeness of etching of the region to be etched can be ensured, so that remaining vacant region is avoided, and the overall display and light-transmission effect of the display panel 10 can be ensured.

With continued reference to FIG. 5 to FIG. 8, the center of the mark group 300 is a first center a, and multiple marks 310 are circumferentially arranged around the first center a; or the multiple marks 310 are spirally arranged around the first center a.

Specifically, referring to FIG. 5 to FIG. 8, the center of the mark group 300 is the first center a, and the arrangements of the multiple marks 310 around the first center a are various.

Further, referring to FIG. 5 and FIG. 6, the multiple marks 310 may be arranged in a ring around the first center a, i.e., the multiple marks 310 present have the same distance from the first center a, and form a mark group 300 in the form of "concentric rings". Specifically, in FIG. 5, the left diagram in FIG. 5 shows a diagram of the final marks 310 in the mark group 310, that is, multiple marks 310 adjacent to the first center a are blocked out by multiple marks far away from the first center a, that is, the center of the mark group 300 is etched first, and then the edge of the mark group 300 is etched. The right diagram in FIG. 5 shows an etching path of the laser etching, in FIG. 5, S1 is a first-step etching process, S2 is a second-step etching process, and S3 is a third-step etching process. In FIG. 5, an etching process of three steps is taken as an example, and the specific number of steps is not limited in embodiments of the present invention. In FIG. 6, the left diagram in FIG. 6 shows a diagram of the final marks 310 in the mark group 300, that is, multiple marks 310 adjacent to the first center a block off multiple marks far away from the first center a, that is, the edge of the mark group 300 is etched first, and then the center of the mark group 300 is etched. The right diagram in FIG. 6 shows an etching path of the laser etching, in FIG. 6, S1 is a first-step etching process, S2 is a second-step etching process, and S3 is a third-step etching process. In FIG. 6, an etching process of three steps is taken as an example, and the specific number of steps is not limited in embodiments of the present invention, the processes of etching are various, and further the arrangements of the marks 310 in the mark group 300 are fed back to be various.

Further, referring to FIG. 7 and FIG. 8, multiple marks 310 are spirally arranged around a first center a, and the multiple marks 310 include an arrangement in an inner-to-outer spiral path and an arrangement in an outer-to-inner spiral path. For example, referring to FIG. 7, a left side diagram in FIG. 7 represents an inner to outer arrangement path of multiple marks 310 in the mark group 300, that is, the etching is performed spirally from the inner side of the mark group 300 to the outer side of the mark group 300 when the laser etching is performed, and a right diagram in FIG. 7 represents an etching path of laser, representing a spiral etching path, and the marks shown in dashed lines in FIG. 7 represent initial etching marks. Referring to FIG. 8, a left side diagram in FIG. 8 represents an outer to inner arrangement path of multiple marks 310 in the mark group 300, that is, the etching is performed spirally from the outer side of the mark group 300 to the inner side of the mark group 300 when the laser etching is performed, and a right diagram in FIG. 8 represents an etching path of laser, representing a spiral etching path, and the marks shown in dashed lines in FIG. 8 represent initial etching marks. These drawings also represent that the processes of etching are various, and further the arrangements of the marks 310 in the mark group 300 are fed back to be various.

Figure 9:
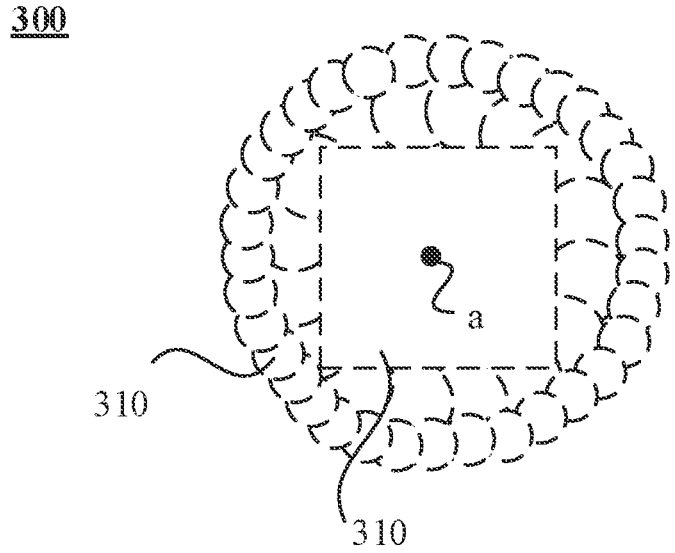
FIG. 9 is a structural diagram of another mark group according to an embodiment of the present invention.
Figure 10:
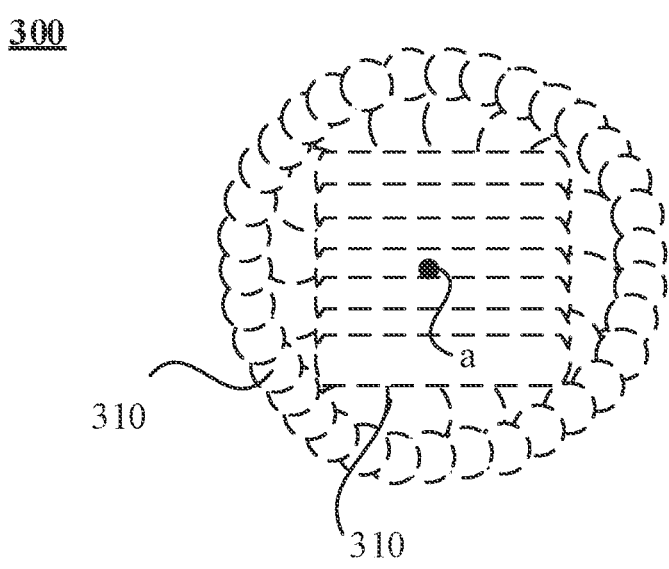
FIG. 10 is a structural diagram of another mark group according to an embodiment of the present invention.

FIG. 9 is a structural diagram of another mark group according to an embodiment of the present invention, and FIG. 10 is a structural diagram of another mark group according to an embodiment of the present invention. Referring to FIG. 5 to FIG. 10, the marks 310 include one or more of a dot-shaped mark, a rectangular-shaped mark, or a strip-shaped mark.

Further, in the mark group 300, the shapes of the marks 310 are various, for example, the mark group 300 may include multiple dot-shaped marks, multiple rectangular-shaped marks, or multiple strip-shaped marks, or the mark group 300 may include a combination of the above-described different shapes of marks, i.e., the shapes of the marks 310 are various, which is not specifically limited in the embodiments of the present invention.

For example, referring to FIG. 5 to FIG. 8, the multiple marks 310 in the mark group 300 are dot-shaped marks, that is, the laser for etching outputs dot laser to perform etching. It is to be noted that although the marks in FIG. 5 to FIG. 8 are all dot-shaped marks, due to the sequence of the etching, some of the dot-shaped marks are blocked out by adjacent dot-shaped marks. As shown in FIG. 9, the mark 310 near the first center a in the mark group 300 is a rectangular-shaped mark, the marks 310 around the rectangular-shaped mark are dot-shaped marks, and through the manner that the dot-shaped marks are surroundingly arranged, it is ensured that the dot-shaped marks are enabled to better fit the edge of the mark group 310, thereby ensuring that the marks 310 are filled in a region where the etching is required, without occurrence of over etching or remaining vacant region, and the like. Referring to FIG. 10, the marks 310 near the first center a in the mark group 300 are multiple strip-shaped marks, the marks 310 around the strip-shaped mark are dot-shaped marks, and on the basis of matching the strip-shaped marks to the position characteristics of the center region, the efficiency of the etching and the uniformity of the etched marks 310 are improved. By adjusting the shapes of the marks 310, the variety of the etching is reflected, thereby ensuring the etching effect of the display panel, i.e., ensuring the display effect of the display panel. Moreover, it is also possible to combine different dot-shaped marks, rectangular-shaped marks, or strip-shaped marks based on practical etching requirements, thereby, it can ensure that the marks 310 are suitable for a variety of shapes of the mark groups 300, and a more efficient or simpler etching technique process can be formulated on the basis of different shapes of marks 310, thereby reducing the technique preparation cost of the display panel 10.

With continued reference to FIG. 5, FIG. 6, FIG. 9, and FIG. 10, the marks 310 include marks 310 having at least two different shapes or having at least two different dimension sizes.

Further, the shapes of the multiple marks 310 in the mark group 300 may be different, and the dimension sizes of the multiple marks 310 in the mark group 300 may also be different. Specifically, referring to FIG. 5 and FIG. 6, the marks 310 in the mark group 300 are all dot-shaped marks, and there are two kinds or more kinds of dot-shaped marks with different dimension sizes, that is, the dimension of each of the marks 310 near the first center a is larger than the dimension of each of the marks 310 far away from the first center a. Specifically, the marks 310 near the first center a have large dimensions, and can provide the effect of entire etching. The marks 310 away from the first center a, that is, the marks 310 near the edge of the mark group 300 have small dimensions, which enables the marks 310 near the edge of the mark group 300 to better fit the edge of the mark group 300, thereby ensuring that the marks 310 are filled in a region to be etched without occurrence of over etching or remaining vacant region or the like case. By introducing the marks 310 with different dimension sizes in the mark group 300, i.e., reflecting the difference in the sizes of the spots produced by the laser in the process of etching, the etching is carried out by the spots with different sizes in the mark group 300. Compared with etching by the spots with only one dimension size, etching by the spots with different sizes can improve the efficiency of etching while guaranteeing the etching effect, thereby facilitating achieving high efficiency of preparation of the display panel 10. Further, referring to FIG. 9 and FIG. 10, different shapes of marks 310, such as strip-shaped marks and dot-shaped marks, are included in the mark group 300, and it is also possible that different shapes of marks 310 are included in the mark group 300 and the dimension sizes of the marks 310 are also adjusted, thereby facilitating combination of marks 310 with different dimensions and shapes to configure a more efficient or simpler etching technique process, thereby reducing the production cost of the display panel 10.

Figure 11:
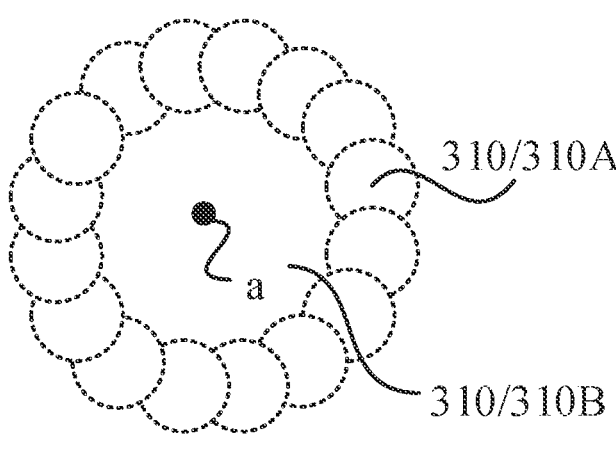
FIG. 11 is a structural diagram of another mark group according to an embodiment of the present invention.
Figure 12:
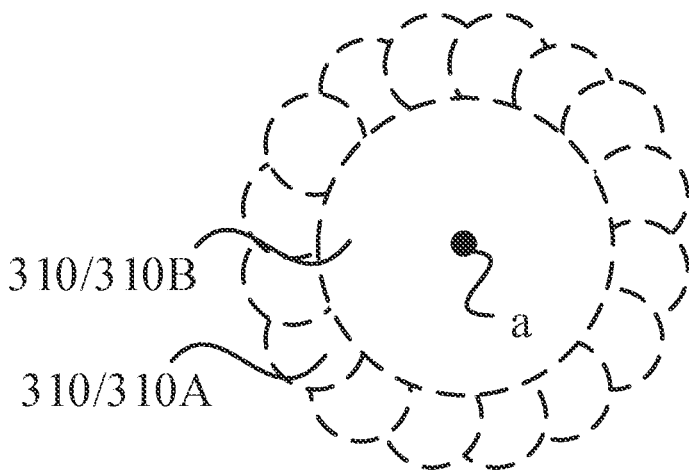
FIG. 12 is a structural diagram of another mark group according to an embodiment of the present invention.
Figure 13:
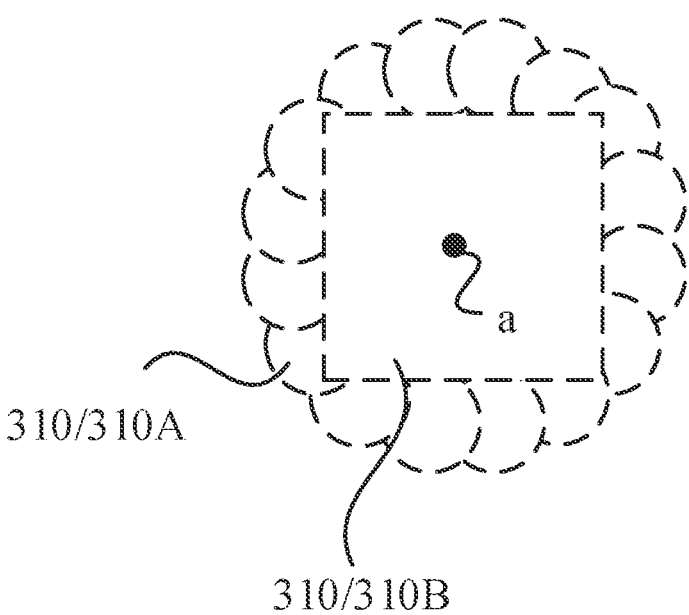
FIG. 13 is a structural diagram of another mark group according to an embodiment of the present invention.

FIG. 11 is a structural diagram of another mark group according to an embodiment of the present invention, FIG. 12 is a structural diagram of another mark group according to an embodiment of the present invention, and FIG. 13 is a structural diagram of another mark group according to an embodiment of the present invention. Referring to FIG. 11 to FIG. 13, the mark group 300 includes first marks 310A and a second mark 310B, the first marks 310A are located at an edge of the mark group 300 and adjacent to the second mark 310B. Specifically, the second mark 310B includes strip-shaped marks and/or a rectangular-shaped mark; and the first marks 310A include dot-shaped marks.

Specifically, the mark group 300 includes the first marks 310A and the second mark 310B, and the first marks 310A are located at an edge of the mark group 300 and adjacent to the second mark 310B, that is, the distance of each of the first marks 310A from the first center a is larger than the distance of the second mark 310B from the first center a. The first marks 310A and the second mark 310B are numbered for distinguishing the marks 310 at different positions in the mark group 300.

Further, referring to FIG. 13, the second mark 310B near the first center a may be a rectangular-shaped mark, and the second mark 310B may also be strip-shaped marks, which is not specifically defined in the embodiment of the present invention. As shown in FIG. 11 to FIG. 13, the first marks 310A adjacent to the edge of the mark group 300 may be dot-shaped marks. In other words, the dot-shaped marks, on the basis of their rounded periphery, may be better adapted to the edge region than the rectangular-shaped mark or the stripe-shaped marks, therefore, the dot-shaped marks are arranged at the edge of the mark group 300, the rectangular-shaped mark or the stripe-shaped mark has a large dimension, and is placed adjacent to the first center a of the mark group 300, so that the number of times of etching for the first film 200 in etching can be reduced, thereby improving the efficiency of etching.

Figure 14:
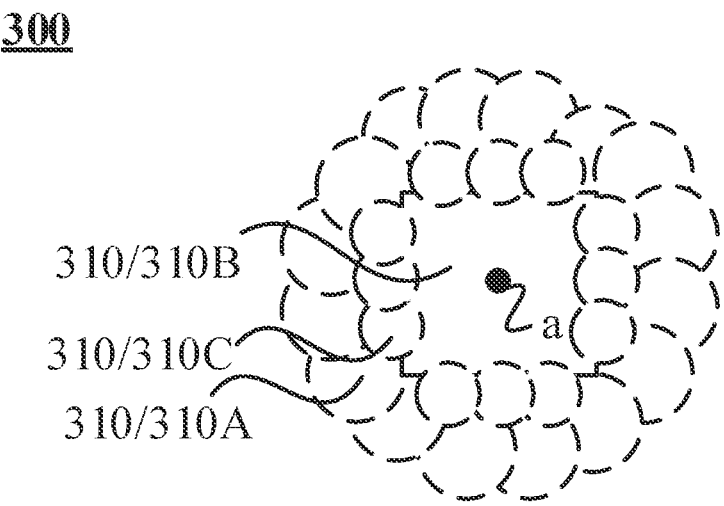
FIG. 14 is a structural diagram of another mark group according to an embodiment of the present invention.

FIG. 14 is a structural diagram of another mark group according to an embodiment of the present invention. Referring to FIG. 14, the mark group 300 further includes third marks 310C, the third marks 310C present are located between the second mark 310B and the first marks 310A; specifically, the dimension of each of the first marks 310A is greater than the dimension of each of the third marks 310C, and the dimension of the second mark 310B is greater than the dimension of each of the third marks 310C.

Specifically, referring to FIG. 14, the mark group 300 further includes the third marks 310C, specifically, the first marks 310A are located at the edge of the mark group 300 and adjacent to the second mark 310B, and the third marks 310C are located between the second mark 310B and the first marks 310A. moreover, the dimension of each of the third marks 310C is smaller than the dimension of each of the first marks 310A and smaller than the dimension of the second mark 310B, that is, the third marks 310C may be filling marks in the mark group 300, that is, the third marks 310C may also match other marks 310 and better fit the edge of the mark group 300, and moreover, the third marks 310C may better fill gaps remained between the other marks 310 to ensure the completeness of the etching. It is to be noted that, based on the gaps between the marks 310, in a case where the marks 310 adjacent to a central region of the mark group 300 are strip-shaped marks and multiple strip-shaped marks are arranged in an etching direction, there may also be a gap between ends of two adjacent strip-shaped marks, the third marks serve as supplementary marks to fill the gap, that is, the third marks 310C as supplementary marks may be used to fill the gaps present at multiple positions in the mark group 300. That is, blank regions that may possibly remain in the mark group 300, that is, regions in which no marks 310 is provided, are filled by the third marks 310C to ensure that the marks 310 are present in each region in the mark group 300, that is, to ensure the etching completeness of the display panel 10, and to ensure the etching effect of the display panel 10, that is, to ensure the display effect of the display panel 10.

With continued reference to FIG. 11 to FIG. 14, the mark group 300 includes first marks 310A and a second mark 310B, the first marks 310A are located at an edge of the mark group 300 and adjacent to the second mark 310B. Specifically, the dimension of each of the first marks 310A is smaller than the dimension of the second mark 310B.

Specifically, with reference to FIG. 11 to FIG. 14, the distance between each of the first mark 310A and the first center a is larger than the distance between the second mark 310B and the first center a, that is, the first mark 310A is closer to the edge of the mark group 300 than the second mark 310B.

Further, the dimension sizes of the first marks 310A and the second mark 310B are further defined on the basis of the positional differentiation of the first marks 310A and the second mark 310B in the mark group 300. Specifically, the dimension of each of the first marks 310A is smaller than the dimension of the second mark 310B, i.e., the marks 310 located at the edge of the mark group 300 have a small dimension and the mark 310 located at the center of the mark group 300 has a large dimension. In other words, in the mark group 300, when the dimension of the second mark 310B is set larger, the total number of the marks 310 can be reduced when it is ensured that all the regions of the mark group 300 are covered with marks 310, that is, the number of times of etching to the region in the etching technique can be reduced, so that the efficiency of the etching can be improved. In the mark group 300, the dimension of each of the first marks 310A is set small, which can ensure that the first marks 310A better fit the edge of the mark group 300, that is, the first marks 310A with a small area can perform cover of marks 310 on the residual region of the edge of the mark group 300. That is, in the process of etching, the laser spot corresponding to each of the first marks 310A is small, the small spot facilitates the etching of the edge region, thereby, ensuring the accuracy of the etching, avoiding the situation of over etching or remaining vacant region, ensuring the etching effect of the display panel 10, that is, ensuring the display effect of the display panel 10.

With continued reference to FIG. 11 to FIG. 14, the first marks 310A are arranged around the second mark 310B.

Specifically, referring to FIG. 11 to FIG. 14, the first marks 310 and the second mark 310B may be different in dimension or different in shape, as compared with each other. In addition, the first marks 310A and the second mark 310B are different in position within the region of the mark group 300. In general, the first marks 310A located relatively at the edge of the mark group 300 are arranged around the second mark 310B located relatively at the center of the mark group 300, which ensures balanced arrangement of the marks 310 in the mark group 300, and ensures the balanced distribution of the marks 310, thereby reflecting the balance of the laser etching in the process of etching.

Figure 15:
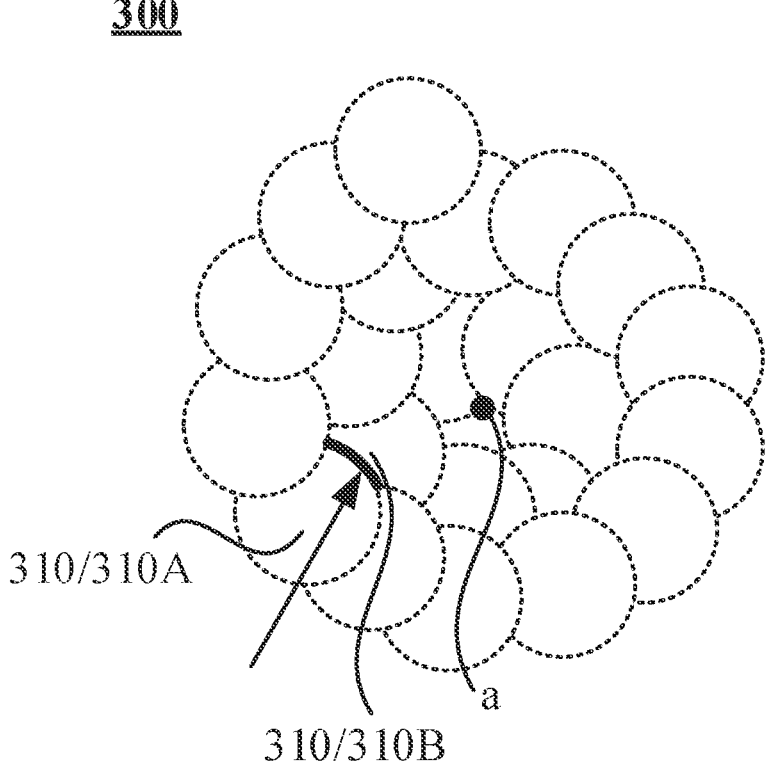
FIG. 15 is a structural diagram of another mark group according to an embodiment of the present invention.
Figure 16:
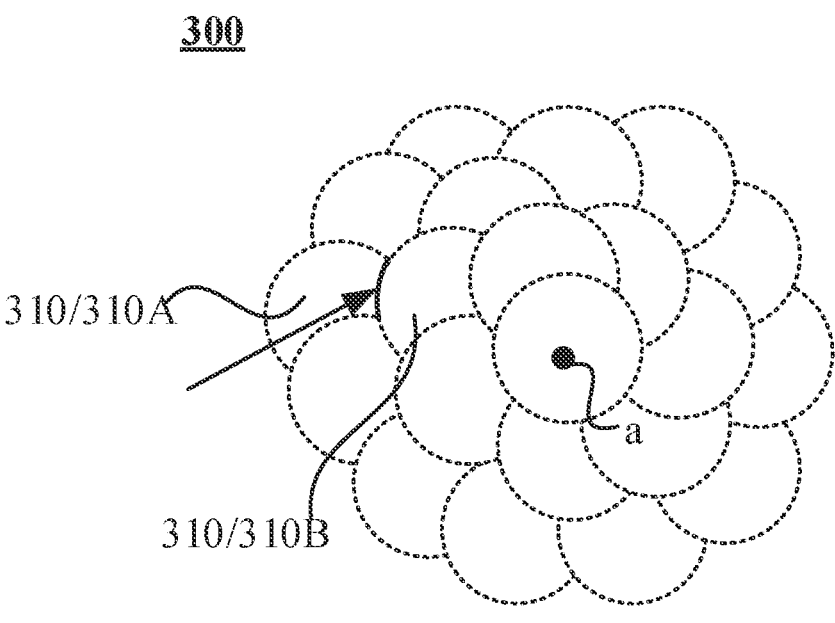
FIG. 16 is a structural diagram of another mark group according to an embodiment of the present invention.

FIG. 15 is a structural diagram of another mark group according to an embodiment of the present invention, and FIG. 16 is a structural diagram of another mark group according to an embodiment of the present invention. Referring to FIG. 15 and FIG. 16, the mark group 300 includes first marks 310A and second marks 310B, the first marks 310A are located at an edge of the mark group 300 and adjacent to the second marks 310B. In the thickness direction of the display panel 10, the first marks 310A overlap with the second marks 310B.

Specifically, the mark group 300 includes the first marks 310A and the second marks 310B, and the first marks 310A are located at the edge of the mark group 300 and adjacent to the second marks 310B, that is, the second marks 310B are closer to the first center a of the mark group 300 than the first marks 310A. Further, in the thickness direction of the display panel 10, the first marks 310A overlap with the second marks 310B, that is, referring to FIG. 15, the first marks 310A cover the second marks 310B, in other words, during the etching, in the mark group 300 in the first film 200, the second marks 310B are first generated and then the first marks 310A are generated, and based on this sequence, a case in which the first marks 310A block out the second marks 310B occurs, that is, the etching process is gradually performed from inside to outside. Further, reference may be made to FIG. 16, the second marks 310B cover the first marks 310A, in other words, during the etching, in the mark group 300 in the first film 200, the first marks 310A are generated first, and then the second marks 310B are generated, and based on this sequence, a case in which the second mark 310B blocks out the first mark 310A occurs, that is, the etching process is gradually performed from outside to inside. That is, based on the different etching paths, different forms of the first marks 310A and the second marks 310B are generated at the mark group 300, which is not specifically limited in the embodiments of the present invention. Based on the variety of the etching, the accuracy of the etching can be ensured according to the practical situation, and the etching effect of the display panel 10 is ensured, that is, the display effect of the display panel 10 is ensured.

With continued reference to FIG. 15, the first mark 310A covers the second mark 310B, and the overlap of the first mark 310A with the second mark 310B is convex with respect to the center of the mark group 300.

Specifically, referring to FIG. 15, the first mark 310A covers the second mark 310B, that is, the first mark 310A blocks out a part of the second mark 310B, and in a corresponding etching process, a spot generating the first mark 310A is later than a spot generating the second mark 310B, and therefore, the second mark 310B is blocked by the first mark 310A. Based on the state ultimately present in the mark group 300, the overlap of the first mark 310A with the second mark 310B (i.e., a position indicated by an arrow in FIG. 15) is convex with respect to the center of the mark group 300, i.e., with respect to the first center a.

With continued reference to FIG. 16, the second mark 310B covers the first mark 310A and the overlap of the first mark 310A with the second mark 310B is concave with respect to the center of the mark group 300.

Specifically, as shown in FIG. 16, the second mark 310B covers the first mark 310A, i.e., the second mark 310B blocks out a part of the first mark 310A, and in the corresponding etching process, a spot generating the first mark 310A is earlier than a spot generating the second mark 310B, thereby causing the first mark 310A to be blocked out by the second mark 310B. Based on the state ultimately present in the mark group 300, the overlap of the first mark 310A with the second mark 310B (i.e., the position indicated by the arrow in FIG. 16) is concave with respect to the center of the mark group 300, i.e., with respect to the first center a.

Figure 17:
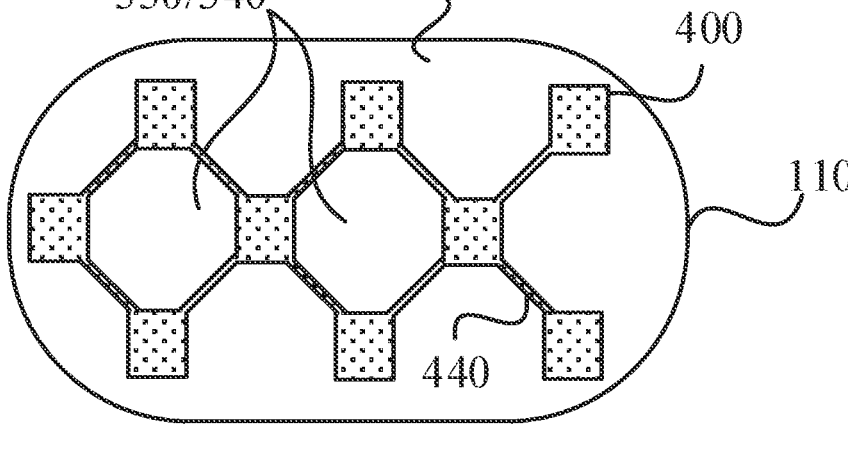
FIG. 17 is a structural diagram of a first display region according to an embodiment of the present invention.

FIG. 17 is a structural diagram of a first display region according to an embodiment of the present invention. Referring to FIG. 17, the first film 200 includes at least one mark region 330, and the mark region 330 includes at least one mark group 300.

Specifically, referring to FIG. 17, in the first display region 110, the first film 200 includes at least one mark region 330. Based on the light-transmission shape of the first display region 110, the mark region 330 may be considered as an etching trace left on the first film 200 after an occlusion film is removed by etching, therefore, it reflects that the mark region 330 corresponds to a light-transmissive region of the first display region 110.

Further, the mark region 330 includes a mark group 300. Referring to FIG. 5 to FIG. 16, each mark group 300 representing a mark region 330 is taken as an example, that is, in the process of etching technique, only one set of lasers is employed to perform the laser etching (the lasers correspondingly generate a mark group 300), the etching to the film or films required to be etched corresponding to the mark region 330 may just be completed, and corresponding etching marks are left on the first film 200. Further, the mark region 330 may include multiple mark groups 300, that is, the area of the mark region 330 is relatively large, and it is required that the multiple mark groups 300 are combined to ensure etching of the entire region, that is, in the process of etching technique, laser etches along a set of paths to correspondingly generate one mark group 300, and if the area of film to be etched is relatively large, the laser is required to perform multiple etching processes to generate multiple mark groups 300 in the mark region 330. The number of mark groups 300 in a mark region 330 is not specifically limited in the embodiments of the present invention, and the number of the mark groups 300 can be regulated by adjusting the sizes and shapes of the laser spots, thereby reflecting the variety of etching, ensuring the effect of etching, and also ensuring the display effect of display panel 10.

With continued reference to FIG. 17, the display panel 10 includes multiple light-emitting elements 400. In the first display region 110, there is a light-transmissive region 340 between two adjacent light-emitting elements 400, and in the thickness direction of the display panel 10, the light-transmissive region 340 overlaps with the mark region 330.

Specifically, referring to FIG. 17, the display panel 10 includes multiple light-emitting elements 400, thereby ensuring the display function of the display panel 10. In order to ensure that the first display region 110 also has the display effect, multiple light-emitting elements 400 are also provided in the first display region 110. Referring to FIG. 2, each of the light-emitting elements 400 includes an anode layer 410, a display function layer 420 and a cathode layer 430. Based on that the first display region 110 may have a component, integrated with an opto-sensor, such as a camera or a fingerprint recognition structure arranged therebelow, that is, the first display region 110 can realize the function of optical signal transmission in addition to the function of light-emitting display, the first display region 110 therefore realizes its light-emitting display function in the region where the light-emitting elements 400 are provided, and is required to realize the light-transmission effect in the region where the light-emitting elements 400 are not provided, that is, the light-transmissive region between two adjacent light-emitting elements 400 is the light-transmissive region 340. Further, the cathode layer 430 in the light-emitting element 400 is provided to cover all the side, and the cathode layer 430 blocks out light rays, thus the cathode layer 430 can be etched by lasers, traces, that is, the marks 310, of the laser etching may be remained on the display function layer 420 in the process of laser etching, and the display function layer 420 is just the first film 200 in the display panel 10.

Further, referring to FIG. 17, the first film 200 may include multiple mark regions 330, based on the display function and the light-transmissive function of the first display region 110 and in the thickness direction of the display panel 10, light-transmissive regions 340 overlap with the mark regions 330, i.e., the light-transmissive regions 340 correspond to the mark regions 330.

Figure 18:
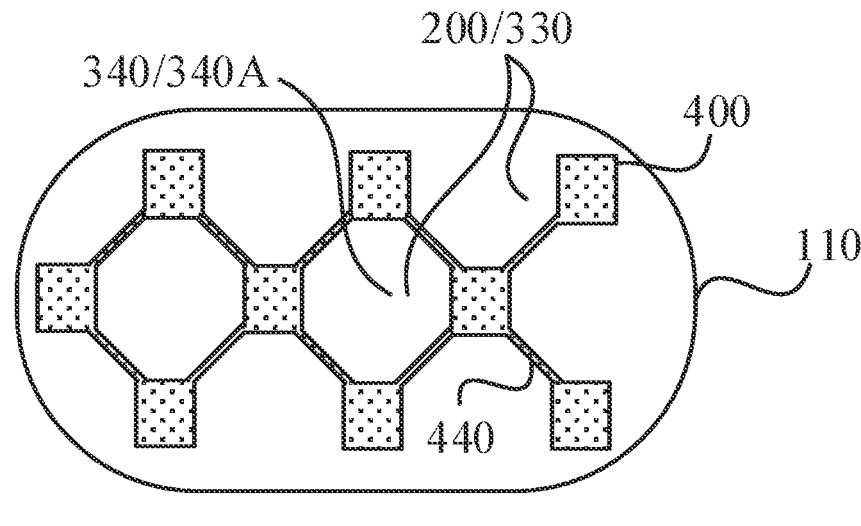
FIG. 18 is a structural diagram of another first display region according to an embodiment of the present invention.
Figure 19:
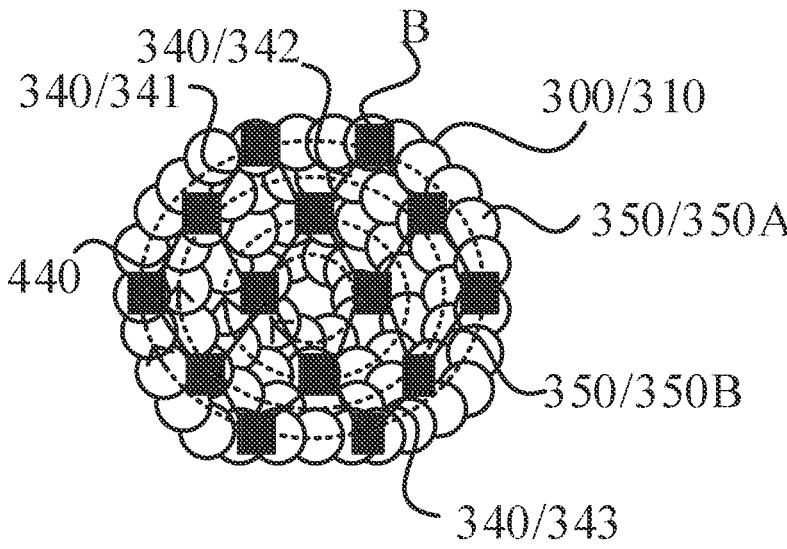
FIG. 19 is a structural diagram of a mark region according to an embodiment of the present invention.
Figure 20:
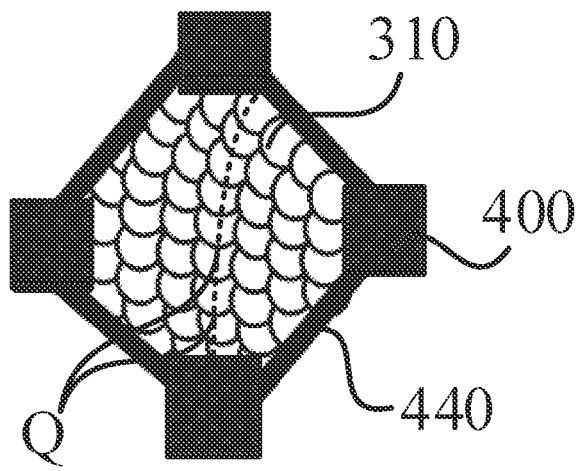
FIG. 20 is a structural diagram of a light-transmissive region according to an embodiment of the present invention.

FIG. 18 is a structural diagram of another first display region according to an embodiment of the present invention, FIG. 19 is a structural diagram of a mark region according to an embodiment of the present invention, and FIG. 20 is a structural diagram of a light-transmissive region according to an embodiment of the present invention. Referring to FIG. 18 to FIG. 20, the first film 200 includes a mark region 330, and the mark region 330 includes a mark group 300. The mark group 300 includes multiple mark units 350, and the multiple mark units 350 form a plurality of rings with different radii. Each of the mark units 350 includes multiple marks 310, and the center of each of the mark units 350 including multiple marks 310 has a same center as the first center a of the mark group 300, that is, the mark units 350 are arranged in a ring-nesting manner.

Specifically, referring to FIG. 18, the display panel 10 includes multiple light-emitting elements 400, thereby ensuring the display function of the display panel 10. In order to ensure that the first display region 110 also has the display effect, multiple light-emitting elements 400 are also provided in the first display region 110. Based on the display function and light-transmissive function of the first display region 110, the light-transmission effect can be achieved in each of the regions where the light-emitting element 400 is not provided in the first display region 110, that is, cathode layer portions corresponding to the regions where the light-emitting element 400 is not provided in the figure are all etched to ensure the light-transmissive performance thereof and the regions where the light-emitting element 400 is not provided are required to achieve the light-transmission effect, that is, the light-transmissive region between two adjacent light-emitting elements 400 is the light-transmissive region 340. Here, the mark region 330 includes laser marks remained when lasers etch other light blocking film, and in a case where the first film 200 includes one mark region 330, the mark region 330 includes multiple light-transmissive regions 340.

Further, in the case where the mark region 330 includes one mark region 330, that is, in the corresponding process of etching, through one set of laser etching paths, multiple light-transmissive regions 340 may just be prepared, thereby generating one mark group 300, which is exemplified by the mark group 300 shown in FIG. 19. It is to be noted that the black block B in FIG. 19 represents a projection corresponding to the cathode layer not etched in the light-emitting element 400 on the first film 200, and the cathode layer in the light-emitting element 400 is maintained, thereby ensuring the display and light-emission functions of the light-emitting element 400, and a connection structure 440 is further present between two adjacent light-emitting elements 400, the connection structure 440 is just a cathode connecting structure between two adjacent light-emitting elements 400, and a region defined by adjacent light-emitting elements 400 and connecting structures 440 connected to the adjacent light-emitting elements 400 is just the above described light-transmissive region 340. The dotted lines in the FIG. 19 show etching paths of the marks 310, specifically, arrows indicate etching directions of the marks 310. It is to be noted that, referring to FIG. 19, the etching paths of the marks may extend from the inside of the mark region 330 to the outside of the mark region 330, and the etching paths of the marks may also extend from the outside to the inside of the mark region 330, which is not specifically limited in the embodiments of the present invention.

Further, referring to FIG. 19, there are multiple rows of etching paths of the marks 310 in each light-transmissive region 340, and the etching paths are arc-shaped, and the arcs are concaved with respect to the center of the mark region 330. It is to be noted that FIG. 19 is merely intended to show the etching paths and the marks, for clearly observing the reference numerals and the like in the FIG. 19, so the number of rows of the etching paths is reduced, that is, what is shown in FIG. 19 does not represent the actual number of rows of the etching paths, and the actual number of the etching paths is greater. Referring to FIG. 20, the number of the marks 310 is greater and the arrangement paths of the marks 310 are more in the light-transmissive region 340.

Further, the etching paths inside different light-transmissive regions 340 (referring to the light-transmissive region 341 and the light-transmissive region 342 in FIG. 19) differ in concave direction with respect to the center of the mark region 330. Moreover, taking the light-transmissive region 341 and the light-transmissive region 343 located on opposite sides of the mark region 330 as examples, the etching paths in the two light-transmissive regions 340 are arc-shaped, reference is made to the tracks Q in FIG. 20, the concave directions of the arcs are opposite, but the concave sides of the two etching paths are both concaved with respect to the center of the mark region 330 or the center of the first display region 110.

Further, referring to FIG. 19 and FIG. 20, the mark group 300 includes multiple mark units 350, each of the mark units 350 includes multiple marks 310, and the center of each of the mark units 350 composed of multiple marks 310 is the same as the first center a, that is, the mark units 350 are arranged in a ring-nesting manner. For example, the light-transmissive region 340 may include therein four to seven mark units 350, i.e., four to seven etching paths, and based on the four to seven mark units 350, pixel resolution of the display panel 10 can be better matched.

With continued reference to FIG. 19, the mark group 300 includes a first mark unit 350A and a second mark unit 350B. The first mark unit 350A is located at an edge of the mark group 300 and adjacent to the second mark unit 350B. The first mark unit 350A includes n marks 310, and the second mark unit includes m marks 310; where, n>m.

Specifically, referring to FIG. 19, the mark group 300 includes multiple mark units 350, which are exemplified by the first mark unit 350A and the second mark unit 350B. It is to be noted that the mark group 300 is not limited to include two mark units 350. Further, the first mark unit 350A is located at a side of the second mark unit 350B facing away from the first center a, and the first mark unit 350A is closer to the edge of the mark group 300 than the second mark unit 350B. Further, the area of each mark 310 in the first mark unit 350A is smaller than the area of each mark 310 in the second mark unit 350B, and the number of the marks 310 included in the first mark unit is larger than the number of the marks 310 included in the second mark unit, that is, the number of the marks 310 in the mark unit 350 at the outer side in the mark group 300 is larger, so that the mark unit 350 at the outer side well covers the edge of the mark group 300. In the corresponding etching process, the mark group 300 etched with small laser spots corresponds to the periphery of the film required to be etched, so that the effect of the etching is ensured, and the accuracy of the etching is promoted, thereby ensuring the display effect and the light-transmission effect of the display panel 10.

Figure 21:
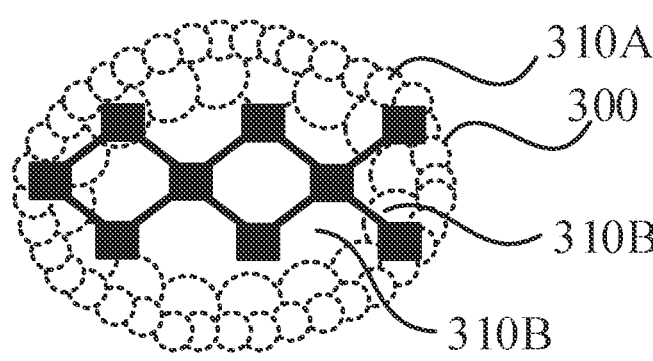
FIG. 21 is a structural diagram of another mark region according to an embodiment of the present invention.

FIG. 21 is a structural diagram of another mark region according to an embodiment of the present invention. Referring to FIG. 21, the mark region 330 includes one mark group 300. The mark group 300 includes multiple peripheral marks 310A and multiple inside marks 310B, and the peripheral marks 310A surround the inside marks 310B. The peripheral marks 310B are arranged along the shape of the mark region 330.

Specifically, referring to FIG. 21, the mark group 300 includes multiple peripheral marks 310A, where the peripheral marks 310B are arranged along the shape of the mark region 330, that is, the peripheral marks 310B are located at the edge of the mark group 300, and based on the edge shape of the mark group 300, the peripheral marks 310B are arranged curvilinearly along the edge shape of the mark group 300.

Further, the mark group 300 further includes multiple inside marks 310B, and the peripheral marks 310A surround the inside marks 310B, i.e., the inside marks 310B are located closer than the peripheral marks 310A to the first center a of the mark group 300. It is to be noted that, referring to FIG. 21, a kind of mark group 300 is taken as an example for illustration, a part of the inside marks 310B may be blocked out by the peripheral marks 310A, and there is also a case in which a part of the inside marks 310B do not overlap with the peripheral marks 310A, that is, in the process of etching, lasers etch the center of the mark group 300 first and then etch the periphery of the mark group 300. Further, there is also another kind of mark group 300 in which the peripheral marks 310A can be blocked out a part of the inside marks 310B, that is, in the process of etching, lasers etch the periphery of the mark group 300 first and then etch the center of the mark group 300, which is not specifically limited in the embodiments of the present invention. That is, based on the variety of arrangement of the mark group 300, the variety of the etching process is reflected, that is, the pattern of the mark group 300 remained in the first film 200 can be adjusted in conjunction with the area and shape practically required to be etched, so that the efficiency of etching is ensured, and the display effect and light-transmission effect of the display panel 10 are further ensured.

Figure 22:
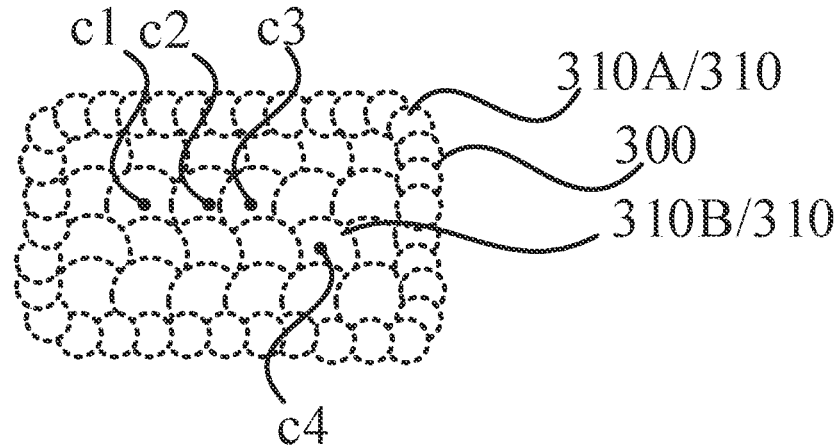
FIG. 22 is a structural diagram of another mark region according to an embodiment of the present invention.
Figure 23:
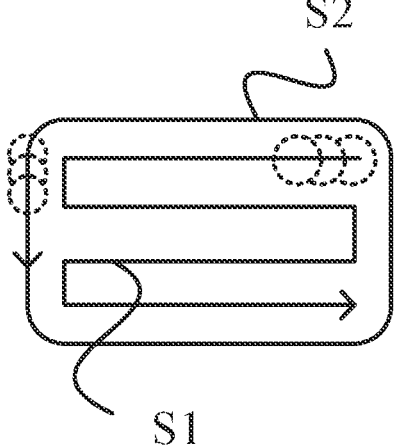
FIG. 23 is a diagram of etching paths of marks in FIG. 22.

FIG. 22 is a structural diagram of another mark region according to an embodiment of the present invention, FIG. 23 is a diagram of etching paths of marks in FIG. 22, and referring to FIG. 22 and FIG. 23, multiple inside marks 310B are arranged linearly. There are three adjacent inside marks 310B whose centers are located in the same straight line, and there are three inside marks 310B whose centers are not located in the same straight line.

Specifically, the peripheral marks 310A are arranged along the shape of the mark region 330, and the inside marks 310B may be arranged in a straight line or in a curved line, i.e., the arrangements of the inside marks 310B are various. Referring to FIG. 22, the inside marks 310B arranged in a straight line is taken as an example for illustration. Specifically, multiple inside marks 310B are arranged in a straight line, and based on the presence of blocking out between adjacent marks 310B, all the inside marks 310B are finally arranged in a fish scale-like arrangement in the mark group 300. Further, referring to FIG. 23, in the corresponding etching technique, the laser may perform etching to the film to be etched along a circular linear motion track (referring to an etching path S1 in FIG. 23), so that the etching effect on the central region is ensured, and the fish scale-like marks 310 may be remained on the first film 200. Further, a loop-shaped surrounding etching track (referring to an etching path S2 in the figure) is then adopted, it is possible to ensure that the edge of the mark group 300 can be better fitted, thereby ensuring that the marks 310 are filled in the region to be etched without occurrence of over etching or remaining vacant region or the like.

Further, there are three adjacent inside marks 310B whose centers are located in the same straight line, reference is made to centers c1, c2, and c3 in FIG. 22, and there are three inside marks 310B whose centers are not located in the same straight line, reference is made to the centers c1, c3, and a center c4 in FIG. 22, i.e., reflecting the arrangement of the inside marks 310B, also reflecting the etching path in the etching technique. By using the above-mentioned etching path, and corresponding to the pattern of the mark group 300 remained in the first film 200, it is possible to ensure the completeness of the etching, and further ensure the efficiency of the etching, the display effect and light-transmission effect of the display panel 10.

Figure 24:
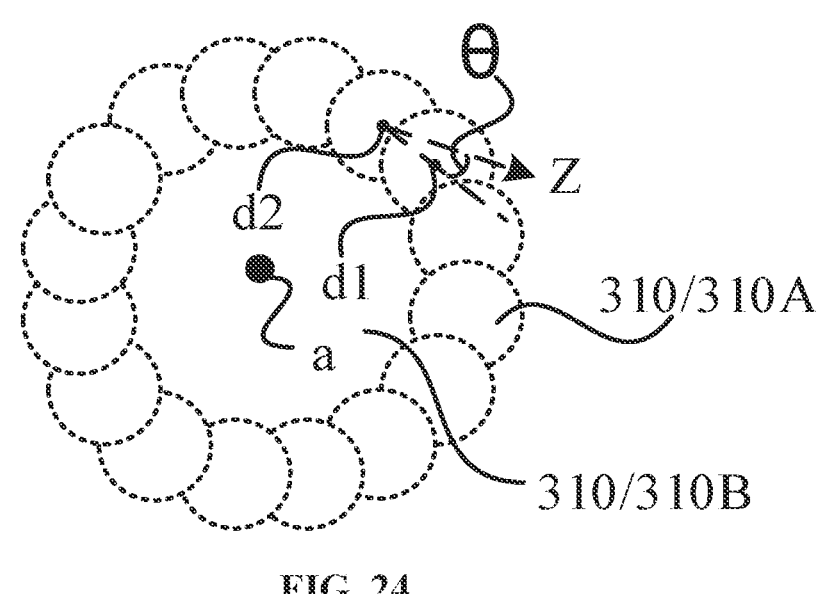
FIG. 24 is a structural diagram of another mark group according to an embodiment of the present invention.

FIG. 24 is a structural diagram of another mark group according to an embodiment of the present invention. Referring to FIG. 24, in an arrangement direction of marks 310, an angle between a line connecting centers of two adjacent marks 310 with respect to the arrangement direction is a first angle $\theta$; where $\theta \leq 0.3°$.

Further, the marks 310 in the mark group 300 are arranged along a curvilinear arrangement direction, and the arrangement direction may be a spiral arrangement from inside to outside, or a spiral arrangement from outside to inside, or the like, the specific curvilinear arrangement manner is not specifically limited in the embodiments of the present invention. For example, referring to FIG. 24, the marks 310 arranged spirally from inside to outside is taken as an example for illustration.

Specifically, a line connecting centers of two adjacent marks 310 is just a connection line between d1 and d2 in the FIG. 24, the arrangement direction of the marks 310 in the FIG. 24 is taken as an example, and a motion direction of their arrangement is shown as Z in the FIG. 24. Further, the line connecting centers of two adjacent marks 310 is at a first included angle $\theta$ with respect to the arrangement direction, and the angle of the first included angle $\theta$ should try to be reduced, thereby ensuring compact of the arrangement of the marks 310 and reflecting the completeness of the etching. It is to be noted that the first included angle $\theta$ may be an included angle between the line connecting two adjacent peripheral marks 310A and the tangent line of the mark region 330, the first included angle $\theta$ may also be an included angle between a line connecting centers of two adjacent inside marks 310B with respect to the arrangement direction in a case where multiple inside marks 310B are present inside, which is not specifically limited in the embodiments of the present invention.

Figure 25:
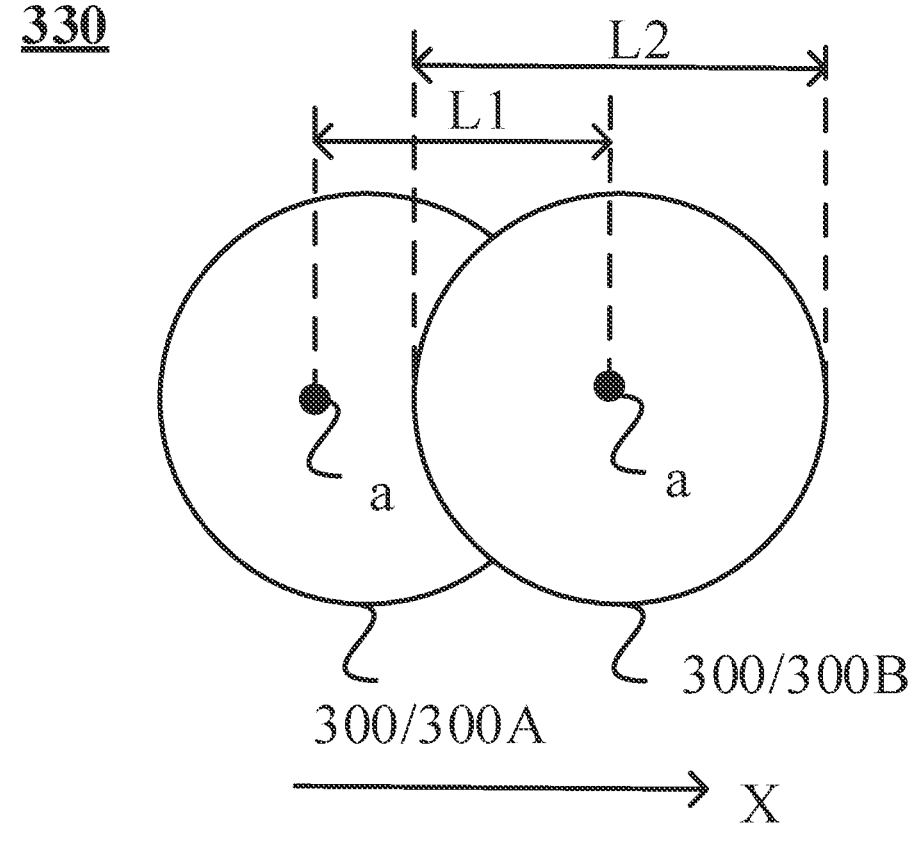
FIG. 25 is a structural diagram of another mark region according to an embodiment of the present invention.
Figure 26:
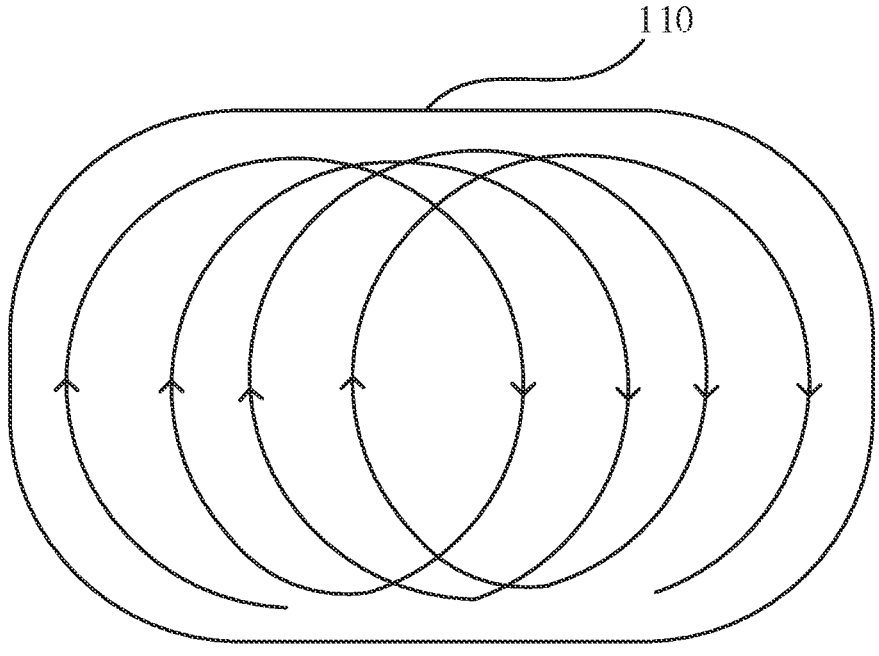
FIG. 26 is a diagram of etching paths of marks in FIG. 25.

FIG. 25 is a structural diagram of another mark region according to an embodiment of the present invention, and FIG. 26 is a diagram of etching paths of marks in FIG. 25. Referring to FIG. 25 and FIG. 26, the mark region 330 includes multiple mark groups 300, and first centers a of the multiple mark groups 300 are arranged in a first direction X. The distance between the first centers a of two adjacent mark groups 300 is L1; the length of a mark group 300 in the first direction X is L2; where L1<L2, L1 and L2 are positive numbers, and the first direction X is a long axis direction of the mark region 330.

Here, the mark region 330 may include multiple mark groups 300. Referring to FIG. 25, one mark region 330 including two mark groups 300 is taken as an example for illustration. The number of the mark groups 300 in the mark region 330 can be set variously based on practical conditions, which is not specifically limited in the embodiments of the present invention. It is to be noted that each of the mark groups 300 includes multiple marks 310, and in view of clearly and intuitively displaying the arrangement of the mark groups 300 in the mark region 330, the marks 310 in the mark groups 300 are not shown, and reference may be made to the foregoing description for the arrangement of the marks 310 in the specific mark groups 300.

Specifically, referring to FIG. 25, the distance between the first centers a of the two mark groups 300 is L1, the length of a mark group 300 in the first direction X is L2, and L1<L2, i.e., there is overlap between the two adjacent mark groups 300, so that the distance between the first centers a of the two mark groups 300 may be smaller than the length of each of the mark groups 300 in the first direction X, thereby reflecting the arrangement of the mark groups 300 in the mark region 330, in other words, the arrangement is similar to a case where the mark group 300 in the mark region 330 performs a translation to achieve the arrangement of the marks 310 in the mark group 300 at the final position. By the overall arrangement of the marks 310 according to the embodiments of the present invention, the effect of etching is ensured, thereby ensuring the display effect and light-transmission effect of the display panel 10 and ensuring the functionality of the display panel 10.

Based on the etching process of the film to be etched, an arrangement path of marks 310 in each of the mark groups 300 is just a trace remained by an etching path in which a laser etches for one loop on the first film 200. Multiple mark groups 300 are included in the mark region 330, referring to the diagram of the etching path provided in FIG. 26, it indicates that in the process of etching, the laser, while performing etching along its own etching path, performs a translation etching for the etching process, thereby ensuring the completeness of etching. The marks generated on the basis of the etching process may be seen as spring coil-type marks, that is, reflecting the arrangement path of the marks 310 in the mark group 300, and further reflecting the arrangement of multiple mark groups 300.

As shown in FIG. 26, optionally, the shape of the first display region 110 may be an ellipse or a rounded rectangle or may be an elongated shape with convex arcs at two ends.

Still referring to FIG. 25, the mark region 330 includes a first mark group 300A and a second mark group 300B, and the first mark group 300A is located at an edge of the mark region 330 and adjacent to the second mark group 300B. The periphery shape of the second mark group 300B includes a circular shape or an elliptical shape. The periphery shape of the first mark group 300A includes an arc shape or a crescent shape.

Further, referring to FIG. 25, the mark region 330 including two mark groups 300 is taken as an example for illustration. Specifically, the mark region 330 includes a first mark group 300A and a second mark group 300B, and the first mark group 300A is located at the edge of the mark region 330 and adjacent to the second mark group 300B, and a part of the first mark group 300A is blocked out by the second mark group 300B, which further reflects that a position where the first mark region 300A will be generated is etched first, and a position where the second mark region 300B will be generated is etched later.

Further, based on the above-mentioned etching process, the periphery shape of the second mark group 300B may be circular or elliptical, referring to FIG. 25, it is taken as an example for illustration that the periphery shape of the second mark group 300B is circular. Further, the periphery shape of the first mark group 300A may be an arc shape or a crescent shape, referring to FIG. 25, it is taken as an example for illustration that the periphery shape of the first mark group 300A is a crescent shape, and the specific shape and size of the first mark group 300A depends on the distance and direction between a first center a of the first mark group 300A and a first center a of the second mark group 300B, that is, depends on an laser etching gap or etching path generating the first mark group 300A and the second mark group 300B during etching, which is not specifically limited in the embodiments of the present invention.

Still referring to FIG. 2, the display panel 10 further includes a light blocking layer 700 at a side of the driving components 530 facing away from the first film 200, the light blocking layer 700 includes a light-transmissive region 710 and a first light blocking region 720. In the thickness direction of the display panel 10, the light-transmissive region 710 overlaps with the mark groups 300, and a portion of the first film 200, between two adjacent mark groups 300, overlaps with the first light blocking region 720.

Further, the display panel 10 further includes a light blocking layer 700, and the light blocking layer 700 can block transmission of light rays and prevent penetration of lasers in the process of laser etching, thereby ensuring that the region corresponding to where the light blocking layer 700 is provided is not etched by a laser. Specifically, referring to FIG. 2, the light blocking layer 700 is arranged between the substrate 510 and the driving components 530, and the light blocking layer 700 includes the light-transmissive region 710 and the first light blocking region 720. The light-transmissive region 710 is just a hollowed-out region of the light blocking layer 700, that is, light rays can be transmitted in this region to ensure that the laser etching technique is carried out. The first light blocking region 720 is just a blocking region of the light blocking layer 700, that is, the light rays are blocked in the region, and the corresponding portion of the film will not be etched by a laser.

For example, the light-transmissive region 710 overlaps with the position where the mark groups 300 are located in the first film 200 in the thickness direction of the display panel 10, and a region B in FIG. 2 indicates the region where the marks 310 are present in the first film 200. Also, the first light blocking region 720 overlaps with the region in which the mark group 300 is not present in the first film 200, and by providing the first light blocking region 720, interference of lasers for etching to the driving components 530 can be avoided, and it is also possible to ensure that the film (e.g., the cathode layer 430) requiring the etching is not etched in the region corresponding to the first light blocking region 720, thereby ensuring the light-emitting effect in the region, and ensuring the display function of the display panel 10.

Figure 27:
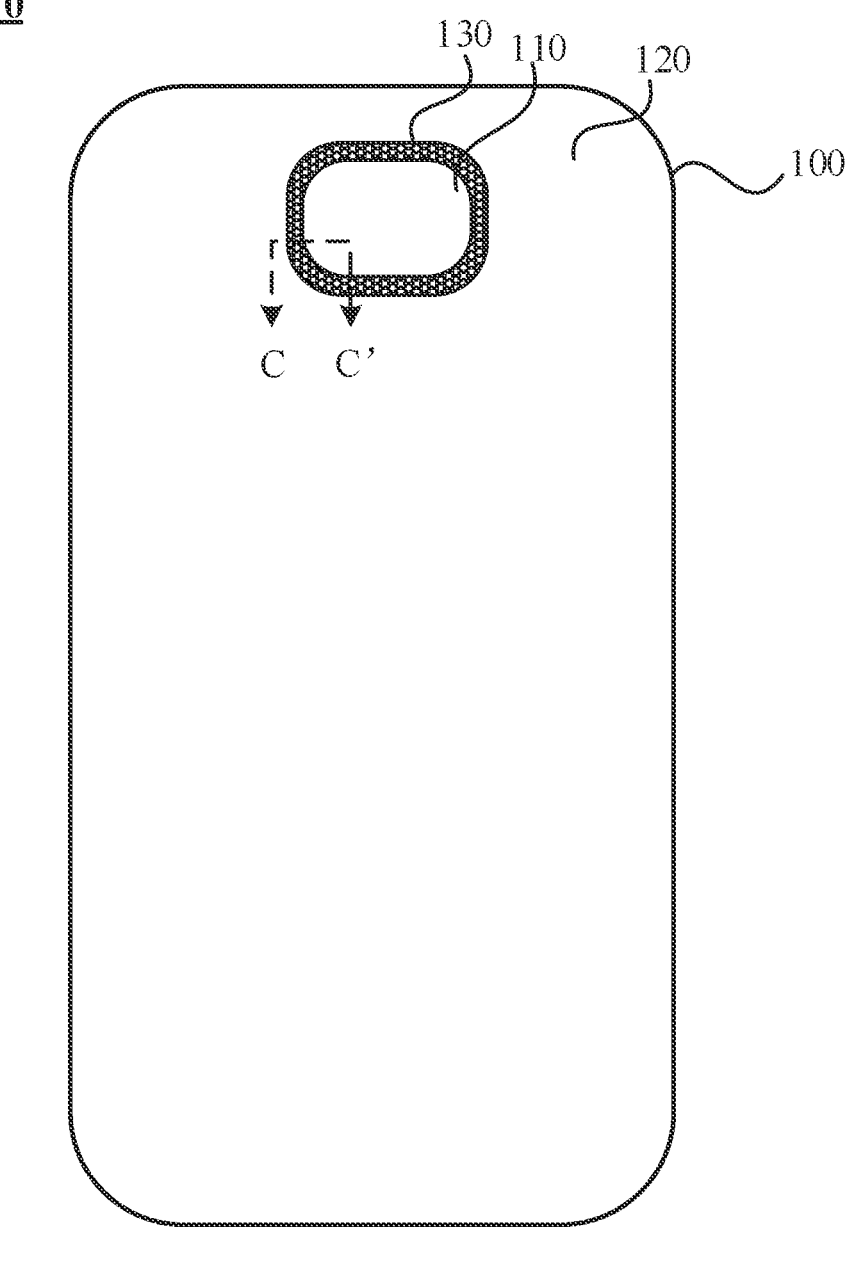
FIG. 27 is a structural diagram of another display panel according to an embodiment of the present invention.
Figure 28:
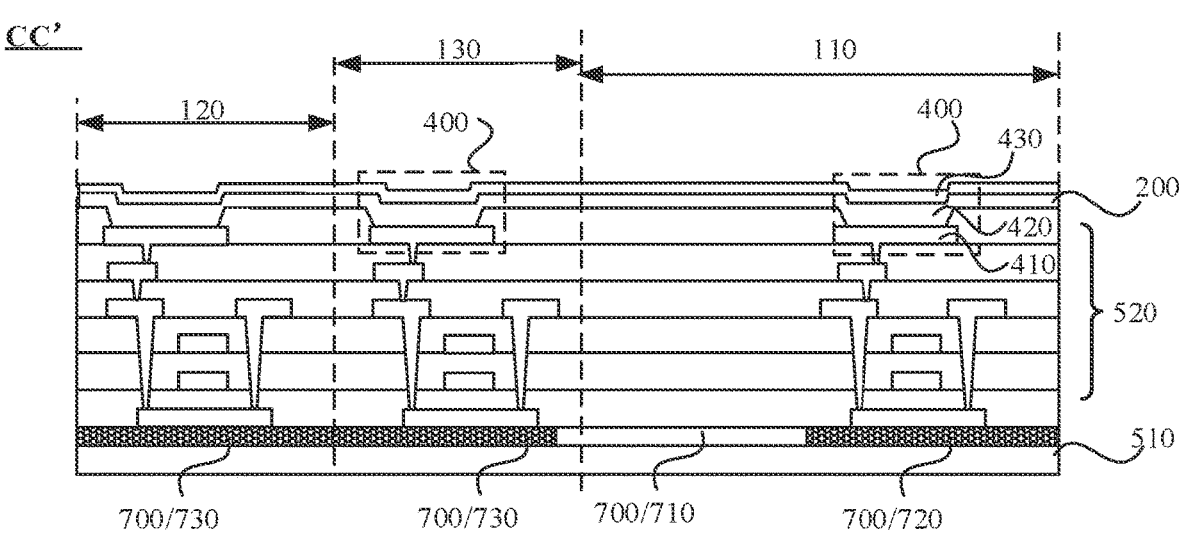
FIG. 28 is a structural diagram taken along line CC' in FIG. 27.

FIG. 27 is a structural diagram of another display panel according to an embodiment of the present invention, and FIG. 28 is a structural diagram of FIG. 27 taken along a section line CC'. Referring to FIG. 27 and FIG. 28, the display panel 10 further includes a second display region 120 and a transition display region 130. The transition display region 130 surrounds at least a portion of the first display region 110, and the second display region 120 surrounds at least a portion of the transition display region 130. The light blocking layer 700 further includes a second light blocking region 730 that overlaps with the transition display region 130 in the thickness direction of the display panel 10.

Specifically, referring to FIG. 27 and FIG. 28, the display panel 10 includes a first display region 110 and the second display region 120, specifically, the first display region 110 may have a component, integrated with an opto-sensor, such as a camera or a fingerprint recognition structure arranged therebelow, that is, the first display region 110 may transmit external light rays in addition to realizing a display function, thereby realizing a function of photographing or user facial unlocking and the like. The second display region 120 may be a main display region, thus guaranteeing the main display effect of the display panel 10.

Further, the display panel 10 further includes the transition display region 130, and the transition display region 130 is located between the first display region 110 and the second display region 120. Based on the functional difference between the first display region 110 and the second display region 120, the balance of overall display or light-transmissive performance of the display panel 10 is ensured by providing the transition display region 130, so that an abrupt display or light-transmissive difference is avoided, and adversely affecting the overall display effect and light-transmission effect of the entire display panel 10 are avoided.

Further, referring to FIG. 28, the light blocking layer 700 further includes a second light blocking region 730, and the second light blocking region 730 overlaps with the transition display region 130. Based on the extension of the light blocking layer 700, the second light blocking region 730 may also overlap with the second display region 120. Specifically, the first light blocking region 720 is located in the first display region 110, and based on the requirements of the first display region 110 for light-transmissive performance, the segments of the first light blocking region 720 are dispersed and have small dimensions. The light-transmissive performance of the transition display region 130 is weaker than that of the first display region 110, so the dimension of the second light blocking region 730 located in the transition display region 130 is larger than the dimension of the first light blocking region 720 located in the first display region 110. The light-transmissive performance of the transition display region 130 is stronger than that of the second display region 120, so the dimension of the second light blocking region 730 located in the transition display region 130 is smaller than the dimension of the second light blocking region 730 located in the second display region 120.

Figure 29:
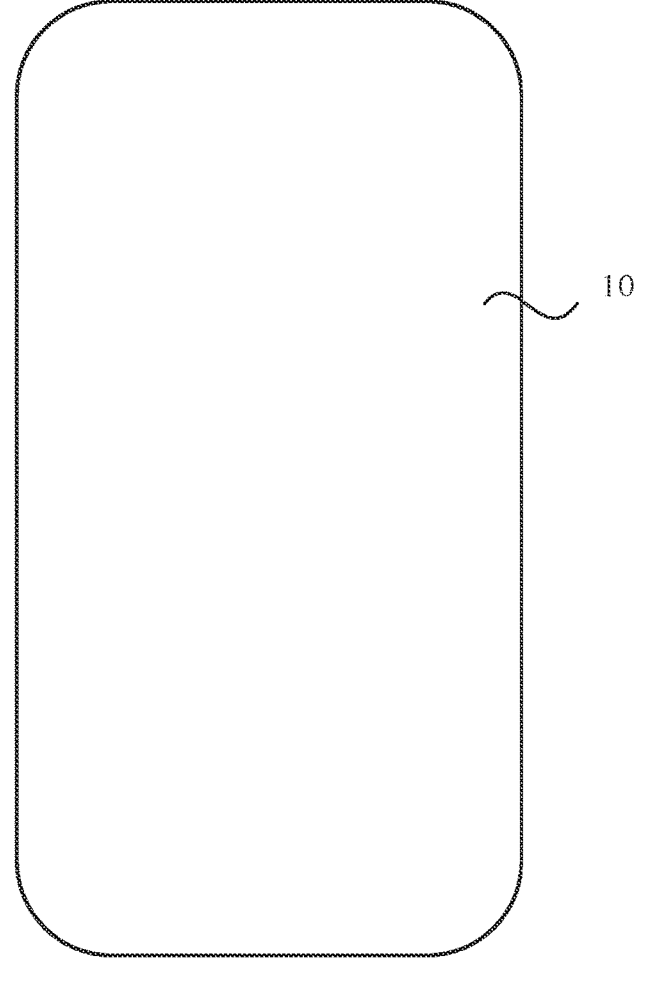
FIG. 29 is a structural diagram of a display apparatus according to an embodiment of the present invention.

Based on the same inventive concept, a display apparatus is further provided according to embodiments of the present invention, and FIG. 29 is a structural diagram of a display apparatus according to an embodiment of the present invention. As shown in FIG. 29, the display apparatus 1 includes the display panel 10 according to any one of the above-described embodiments, therefore, the display apparatus 1 according to the embodiment of the present invention has corresponding advantages in the above-described embodiments, and the details are not described herein. For example, the display apparatus 1 may be an electronic device such as a mobile phone, a computer, an intelligent wearable device (e.g., a smart watch), an in-vehicle display device, which is not limited in the embodiments of the present invention.

Figure 30:
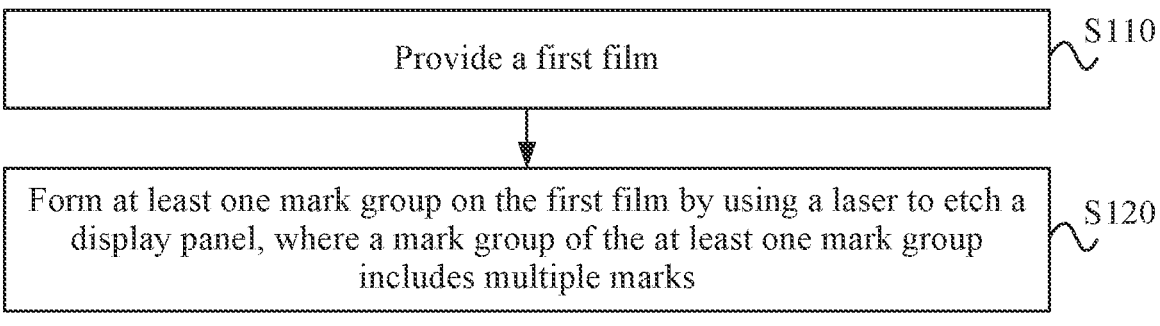
FIG. 30 is a flowchart of a preparation method of a display panel according to an embodiment of the present invention.

Based on the same inventive concept, a preparation method of a display panel is further provided according to an embodiment of the present invention. FIG. 30 is a flowchart of a preparation method of a display panel according to an embodiment of the present invention. Referring to FIG. 30, the preparation method includes: S110 and S120.

In S110, a first film is provided.

Specifically, the display panel includes a display region for implementing a display function of the display panel. The display region further includes a first display region. Specifically, each display region and the first display region is provided with multiple light-emitting elements, that is, ensuring the overall display effect of the entire display panel.

Further, for the first display region, for example, a component, in which an opto-sensor is integrated, such as a camera or a fingerprint recognition structure may be arranged below the first display region, thus, in addition to the function of light-emitting display, the first display region may further implement a function of optical signal transmission, for example, at least one of photographing, biometric recognition and the like. That is, the first display region may be transmissive to external light rays in addition to implementing the display function, thereby implementing a function such as photographing or user facial unlocking. The function of the first display region is not specifically limited in the embodiments of the present invention.

Further, the light-emitting element in the display panel includes an anode layer, a display function layer and a cathode layer. Electrons and holes generated between the anode layer and the cathode layer emit light when the electrons and the holes meet in the display function layer, thereby realizing display light emission of the display panel.

In the first display region, the cathode layer in the light-emitting element may be designed to be patterned, that is, ensuring that the cathode layer in the first display region has a light-transmissive region, and further, it is possible to ensure that the component in which the opto-sensor is integrated, such as a camera or a fingerprint recognition structure arranged below the light-transmissive region of the cathode layer in the first display region can receive external light rays. Specifically, the cathode layer may be laser etched when being prepared, and laser rays remove portions of the cathode layer. For example, laser is emitted from a backlight side of the display panel to the cathode layer, and the laser rays remove part of the cathode layer to form a hollow-out region, namely, the light-transmissive region, thereby realizing the patterned design of the cathode layer.

Further, the display panel further includes a first film, and subsequently, in performing the etching technique, marks may be generated and remained on the first film.

In S120, a laser is used to etch the display panel and form at least one mark group on the first film, a mark group of the at least one mark group includes multiple marks.

Further, after being etched, the first film includes at least one mark group, and the mark group includes multiple marks. Here, the marks formed in the mark group may be remained traces generated by the etching technique during the preparation of the display panel, such as the laser etching marks remained after the laser etching. In view that at least one mark group is included in the first film and the numbers of marks in the mark groups are various, it reflects the variety of the etching process in the preparation process of the display panel, for example, the variety of the etching track, the variety of the etching shape, which is not specifically limited herein in the embodiments of the present invention, so that the etching effect of the display panel is ensured, or the efficiency of etching of the display panel is promoted, that is, the display effect of the display panel is ensured.

Based on the above, the cathode layer in the light-emitting element is designed to be patterned by laser etching in the first display region. When the cathode layer is etched, the generated etching marks may remain in the display function layer, that is, the display function layer may be the first film mentioned above. Further, in view that not only the cathode layer in the display panel is dependent on the technique of laser etching, other films on which the marks generated by the etching technique remain may also be the first film, which is not specifically limited in embodiments of the present invention.

In summary, with the preparation method of the display panel according to the embodiment of the present invention, the first film includes at least one mark group, and each mark group includes multiple marks. The mark group included in the first film is just remained traces of etching by laser etching in the preparation process of the display panel, and multiple marks are included in the mark group, which reflects the variety of the etching process, thereby ensuring the etching effect of the display panel, i.e., ensuring the display effect of the display panel.

Figure 31:
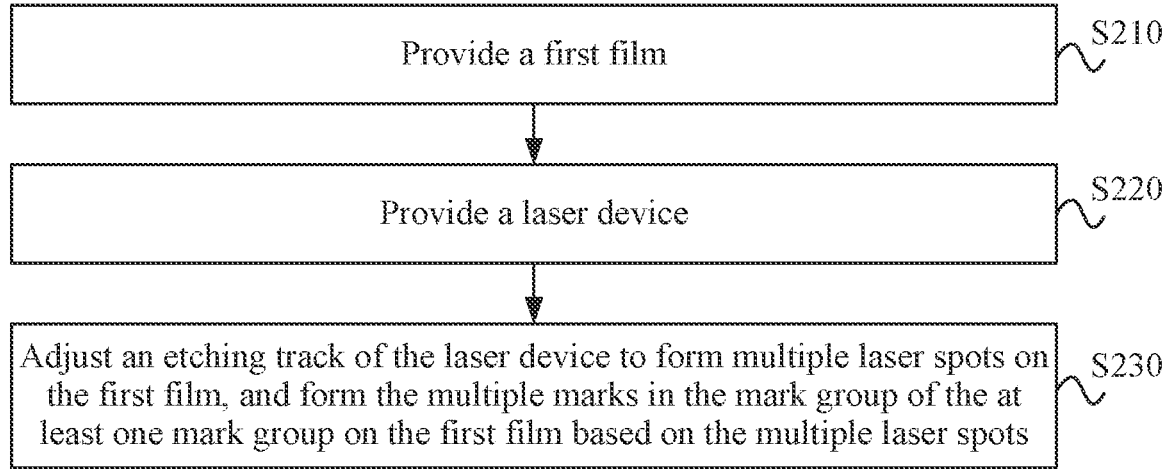
FIG. 31 is a flowchart of another preparation method of a display panel according to an embodiment of the present invention.

FIG. 31 is a flowchart of another preparation method of a display panel according to an embodiment of the present invention, and referring to FIG. 31, the preparation method further includes: S210, S220 and S230.

In S210, a first film is provided.

In S220, a laser device is provided.

In S230, an etching track of the laser device is adjusted to form multiple laser spots on the first film, and multiple marks in the mark group of the at least one mark group are formed on the first film based on the multiple laser spots.

When the laser etching is utilized, a laser device is used to perform etching on the film to be etched, for example, etching is performed for the cathode layer in the light-emitting element. Specifically, the laser spots generated by the laser device are transmitted to the cathode layer to perform etching, and after the cathode layer is etched, multiple laser marks are left on a corresponding display function layer, that is, the display function layer is the first film.

Specifically, a motion track of the laser device may be adjusted, and thus, a motion path of the laser spots may be adjusted, so that marks in multiple arrangements are generated in the mark group of the first film. Specifically, multiple marks may be included in the mark group, and the multiple marks are arranged curvilinearly, that is, the compact arrangement of the marks in the mark region is ensured, and the occurrence of a vacant region is avoided. Further, based on the curvilinear arrangements in different directions, it reflects that the arrangements of the marks in the mark group are various. Further, the arrangement of the marks also reflects to a certain extent an etching track when the laser etches, that is, when the multiple marks are arranged curvilinearly, the laser etching is also performed curvilinearly, so that a better etching effect of the region in which the laser etching is required can be ensured. Furthermore, based on the curvilinear etching path, the completeness of etching of the region in which the etching is required can be ensured, and remaining vacant region is avoided, and the overall display and light-transmission effect of the entire display panel can be ensured.

Further, referring to FIG. 7 and FIG. 8, multiple marks 310 are spirally arranged around a first center a, and the multiple marks 310 include an arrangement in an inner-to-outer spiral path and an arrangement in an outer-to-inner spiral path. For example, referring to FIG. 7, multiple marks 310 in the mark group 300 in the FIG. 7 reflect an inner to outer arrangement path, that is, the etching is performed spirally from the inner side of the mark group 300 to the outer side of the mark group 300 when the laser etching is performed. Referring to FIG. 8, multiple marks 310 in the mark group 300 in the FIG. 8 reflect an outer to inner arrangement path, that is, the etching is performed spirally from the outer side of the mark group 300 to the inner side of the mark group 300 when the laser etching is performed. These drawings also reflect that the processes of etching are various, and further the arrangements of the marks 310 in the mark group 300 are fed back to be various.

FIG. 32 is a flowchart of another preparation method of a display panel according to an embodiment of the present invention, and referring to FIG. 32, the preparation method further includes: S310, S320 and S330.

In S310, a first film is provided.

In S320, a laser device is provided.

In S330, a distance between the laser device and the first film is adjusted to form laser spots of different dimensions on the first film, and multiple marks in the mark group of the at least one mark group are formed on the first film based on the laser spots with different dimensions.

When a laser device is used to etch, a laser device is used to perform etching on a film to be etched, for example, etching is performed for a cathode layer in a light-emitting element. Specifically, the laser device generates laser spots and transmits the spots to the cathode layer to perform etching, and after the cathode layer is etched, multiple laser marks are left on a corresponding display function layer, that is, the display function layer is the first film.

Further, the distance between the laser device and the first film is adjusted, which is also to adjust the distance between the laser device and the film to be etched, and may cause the sizes of laser spots transmitted to the film to be etched from the laser device to be changed, and further cause a difference in the dimensions of the laser marks remained on the first film.

In conjunction with the adjustment to the motion path of the laser device and the adjustment to the distance between the laser device and the first film, the arrangement of the marks remained on the first film may be enriched. Specifically, referring to FIG. 5 and FIG. 6, the multiple marks 310 may be arranged in a ring around the first center a, i.e., a plurality of marks 310 included in the mark group 300 have the same distance from the first center a, and form a mark group 300 in the form of a "concentric ring". In FIG. 5, multiple marks 310 adjacent to the first center a are blocked out by multiple marks far away from the first center a, that is, the center of the mark group 300 is etched first, and then the edge of the mark group 300 is etched. In FIG. 6, multiple marks 310 adjacent to the first center a block out multiple marks far away from the first center a, that is, the edge of the mark group 300 is etched first, and then the center of the mark group 300 is etched, the processes of etching are various, and further the arrangements of the marks 310 in the mark group 300 are fed back to be various. Moreover, there is a difference in the sizes of the marks 310 at different positions in FIG. 5 and FIG. 6, i.e., reflecting the dynamic adjustment to the distance of the laser device from the first film 200. FIG. 5 and FIG. 6 show only two arrangements of marks, and more arrangements of marks can be created by enriching the motion path of the laser device and distance of the laser device from the first film.

FIG. 33 is a flowchart of another preparation method of a display panel according to an embodiment of the present invention, and referring to FIG. 33, the preparation method further includes: S410, S420 and S430.

In S410, a first film is provided.

In S420, at least two laser devices are provided.

In S430, positions of laser spots output by the different laser devices are controlled, and multiple marks in the mark group of the at least one mark group are formed on the first film based on the at least two kinds of the laser spots.

Specifically, two laser devices are provided in the etching process, and laser marks with different shapes or laser marks with the same shape but different dimension sizes can be generated based on different laser devices. Based on the variety of laser marks, the arrangements of the laser marks reserved on the first film after etching are various.

For example, referring to FIG. 5 and FIG. 6, there may be two or more types of laser devices to etch the film to be etched, and different laser devices may output laser marks of different dimensions, leaving marks with different sizes in the first film. Referring to FIG. 9 and FIG. 10, there may be two or more types of laser devices to etch the film to be etched, and different laser devices may output laser marks with different shapes, leaving marks with different shapes in the first film.

Further, the arrangement of marks in the first film also reflects, to a certain extent, the etching track of lasers at etching, that is, the multiple marks are arranged curvilinearly, thus the laser etching is also a curvilinear etching, so that the effect of etching of the region to be laser etched can be ensured good. Furthermore, based on the curvilinear etching path, the completeness of etching to the region in which etching is required can be ensured, so that remaining vacant region is avoided, and the overall display effect and light-transmission effect of the display panel can be ensured. Further, the shapes of the multiple marks in the mark group may be different, and the dimension sizes of the multiple marks may be different. Specifically, by introducing marks with different dimension sizes in the mark group, i.e., reflecting the difference in the sizes of the spots produced by the lasers in the process of etching, the etching is performed by the spots with different sizes in the mark group, which, compared with using the spots with only one dimension size, may improve the efficiency of etching while guaranteeing the effect of etching, thereby enabling the preparation of the display panel to be highly efficient. In general, adjusting the dimension size and shape of the marks facilitates combining marks with different dimensions and shapes to configure a more efficient or simpler etching technique process, thereby reducing the production cost of the display panel.

It is to be noted that the preceding are only preferred embodiments of the present invention and technical principles used therein. It is to be understood by the person skilled in the art that the present invention is not limited to the embodiments described herein. The person skilled in the art can make various apparent modifications, adaptations, and substitutions without departing from the scope of the present invention. Therefore, while the present invention has been described in detail through the preceding embodiments, the present invention is not limited to the preceding embodiments and may include more other equivalent embodiments without departing from the concept of the present invention. The scope of the present invention is determined by the scope of the appended claims.

What is claimed is:

1. A display panel comprising:
a display region comprising a first display region; and
a first film located in the first display region, and the first film comprises at least one mark group, and a mark group of the at least one mark group comprising a plurality of marks;
wherein one of the following is satisfied:
the plurality of marks in the mark group are arranged curvilinearly; or
the mark group comprises first marks and at least one second mark, the first marks being located closer to an edge of the mark group than the at least one second mark; wherein the at least one second mark comprises strip-shaped marks and/or a rectangular-shaped mark; and the first marks comprise dot-shaped marks.

2. The display panel according to claim 1, further comprising:
a substrate;
an array layer located at a side of the substrate, and the array layer comprising driving components;
wherein the first film is an organic film located on the array layer.

3. The display panel according to claim 2, further comprising:
a light blocking layer is located at a side of the driving components facing away from the first film, wherein the light blocking layer comprising a light-transmissive region and a first light blocking region;
wherein in a thickness direction of the display panel, the light-transmissive region overlaps with the mark group, and a portion, between two adjacent mark groups, of the first film overlaps with the first light blocking region.

4. The display panel according to claim 3, further comprising a second display region and a transition display region; the transition display region surrounding at least part of the first display region, and the second display region surrounding at least part of the transition display region;
wherein the light blocking layer further comprises a second light blocking region, and in the thickness direction of the display panel, the second light blocking region overlaps with the transition display region.

5. The display panel according to claim 2, further comprising:
a display function layer located at a side of the array layer facing away from the substrate; wherein the display function layer comprises a plurality of organic films, and the plurality of organic films comprise a combination of one or more of a hole injection layer, a hole transport layer, an electron injection layer, or an electron transport layer.

6. The display panel according to claim 1, wherein a center of the mark group is a first center, and the plurality of marks are circumferentially arranged around the first center; or the plurality of the marks are arranged spirally around the first center.

7. The display panel according to claim 1, wherein the plurality of marks comprise marks with at least two different dimension sizes.

8. The display panel according to claim 7,
wherein the dimension of a first mark is smaller than the dimension of a second mark of the at least one second mark.

9. The display panel according to claim 1, wherein the mark group further comprises third marks, the third marks being located between the at least one second mark and the first marks;
wherein a dimension of a first mark of the first marks is greater than a dimension of a third mark of the third marks and a dimension of the second mark is greater than the dimension of a third mark of the third marks.

10. The display panel according to claim 1, wherein the first marks are arranged around the at least one second mark.

11. The display panel according to claim 1, wherein the first marks overlap with the at least one second mark in a thickness direction of the display panel.

12. The display panel according to claim 11, wherein a first mark of the first marks covers a second mark of the at least one second mark and an overlap of the first mark with the second mark is convex with respect to a center of the mark group.

13. The display panel according to claim 11, wherein a second mark of the at least one second mark covers a first mark of the first marks and an overlap of the first mark with the second mark is concave with respect to a center of the mark group.

14. The display panel according to claim 1, wherein the first film comprises at least one mark region, and the at least one mark region comprises the at least one mark group.

15. The display panel according to claim 14, further comprising a plurality of light-emitting elements;
wherein in the first display region, a light-transmissive region is present between two adjacent light-emitting elements, and in a thickness direction of the display panel, the light-transmissive region overlaps with the mark region.

16. The display panel according to claim 14, wherein the first film comprises one mark region, and the mark region comprises one mark group;

the mark group comprises multiple layers of mark units; and a layer of a mark unit in the multiple layers of mark units comprises a plurality of marks, and the layer of the mark unit has a same center as a first center of the mark group.

17. The display panel according to claim 16, wherein the mark group comprises a first mark unit and a second mark unit, the first mark unit being located closer to an edge of the mark group than the second mark unit;

the first mark unit comprises n marks, and the second mark unit comprises m marks; and wherein, n>m.

18. The display panel according to claim 14, wherein the mark region comprises one mark group;

the mark group comprises a plurality of peripheral marks and a plurality of inside marks, the peripheral marks surrounding the inside marks; and the peripheral marks are arranged along a shape of the mark region.

19. The display panel according to claim 18, wherein the plurality of inside marks are arranged linearly; and the plurality of inside marks includes three adjacent inside marks whose centers are located in a same straight line, and the plurality of inside marks includes three inside marks whose centers are not located in a same straight line.

20. The display panel according to claim 18, wherein in an arrangement direction of the marks, an angle between a line connecting centers of adjacent two marks and the arrangement direction is a first included angle $\theta$;

wherein, $\theta \leq 0.3°$.

21. The display panel according to claim 14, wherein the mark region comprises a plurality of mark groups, first centers of the plurality of mark groups being arranged in a first direction;

wherein a distance between the first centers of two adjacent mark groups is L1; a length of a mark group of the mark groups in the first direction is L2;

wherein L1<L2, L1 and L2 are positive numbers, and the first direction is a long-axis direction of the mark region.

22. The display panel according to claim 21, wherein the mark region comprises a first mark group and a second mark group, the first mark group being located at an edge the mark region and adjacent to the second mark group;

wherein a periphery shape of the second mark group comprises a circular shape or an elliptical shape; and a periphery shape of the first mark group comprises an arc shape or a crescent shape.

23. A display apparatus, comprising the display panel according to claim 1.

24. A preparation method of a display panel, comprising:

providing a first film; and forming at least one mark group on the first film by using a laser to etch the display panel, and a mark group of the at least one mark group comprising a plurality of marks;

wherein one of the following is satisfied:

the plurality of marks in the mark group are arranged curvilinearly; or the mark group comprises first marks and at least one second mark, the first marks being located closer to an edge of the mark group than the at least one second mark; wherein the at least one second mark comprises strip-shaped marks and/or a rectangular-shaped mark; and the first marks comprise dot-shaped marks.

25. The preparation method according to claim 24, wherein the forming at least one mark group on the first film by using a laser to etch the display panel, and a mark group of the at least one mark group comprising a plurality of marks, comprises:

providing a laser device; and adjusting an etching track of the laser device to form a plurality of laser spots on the first film, and forming the plurality of marks in the mark group of the at least one mark group on the first film based on the plurality of laser spots.

26. The preparation method according to claim 24, wherein the forming at least one mark group on the first film by using a laser to etch the display panel, and a mark group of the at least one mark group comprising a plurality of marks, comprises:

providing a laser device;

adjusting a distance between the laser device and the first film to form laser spots of different dimensions on the first film, and, forming the plurality of marks in the mark group of the at least on mark group on the first film based on the laser spots with different dimensions.

27. The preparation method according to claim 24, wherein the forming at least one mark group on the first film by using a laser to etch the display panel, and a mark group of the at least one mark group comprising a plurality of marks, comprises:

providing at least two laser devices, wherein different laser devices provide laser spots of different dimensions or different shapes;

controlling positions of laser spots output by the different laser devices, and forming the plurality of marks in the mark group of the at least one mark group on the first film based on the at least two kinds of the laser spots.

* * * * *